United States Patent
Seo et al.

(10) Patent No.: US 12,041,715 B2
(45) Date of Patent: Jul. 16, 2024

(54) COVER WINDOW, METHOD OF MANUFACTURING THE SAME, AND DISPLAY DEVICE INCLUDING THE COVER WINDOW

(71) Applicant: Samsung Display Co., Ltd., Yongin-Si (KR)

(72) Inventors: Hyunseung Seo, Gwacheon-si (KR); Jihyun Ko, Suwon-si (KR); Dong-Sung Lee, Hwaseong-si (KR); Changmoo Lee, Suwon-si (KR); Jonghwan Cho, Ansan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 388 days.

(21) Appl. No.: 16/937,816

(22) Filed: Jul. 24, 2020

(65) Prior Publication Data
US 2021/0136908 A1    May 6, 2021

(30) Foreign Application Priority Data
Nov. 5, 2019 (KR) .................. 10-2019-0140063

(51) Int. Cl.
*H05K 1/02* (2006.01)
*H05K 5/00* (2006.01)
*H05K 5/03* (2006.01)

(52) U.S. Cl.
CPC ........... *H05K 1/028* (2013.01); *H05K 5/0017* (2013.01); *H05K 5/03* (2013.01); *H05K 2201/10128* (2013.01)

(58) Field of Classification Search
CPC ...................................... H05K 1/028
USPC ........................................ 361/749
See application file for complete search history.

(56) References Cited

U.S. PATENT DOCUMENTS

| | | |
|---|---|---|
| 9,490,312 B2 | 11/2016 | Lee et al. |
| 9,760,125 B2 | 9/2017 | Kim et al. |
| 9,793,512 B2 | 10/2017 | Choi et al. |
| 10,367,173 B1 * | 7/2019 | Wu ............ H04M 1/0268 |
| 10,375,839 B2 | 8/2019 | Jung et al. |
| 10,466,819 B2 | 11/2019 | Nam et al. |
| 10,522,785 B2 | 12/2019 | Kim et al. |
| 10,678,304 B2 | 6/2020 | Namkung et al. |
| 2017/0185212 A1 * | 6/2017 | Jeong ............ G06F 3/0412 |

(Continued)

FOREIGN PATENT DOCUMENTS

| | | |
|---|---|---|
| CN | 109755277 A | 5/2019 |
| EP | 3483639 A2 | 5/2019 |

(Continued)

*Primary Examiner* — Stanley Tso
(74) *Attorney, Agent, or Firm* — CANTOR COLBURN LLP

(57) ABSTRACT

A cover window includes a base layer including a first flat portion and a first bending portion bent from a first end of the first flat portion and a coating layer including a first coating portion disposed on the first flat portion and a second coating portion disposed on the first bending portion and having a thickness less than a thickness of the first coating portion. A first end of the second coating portion has a thickness greater than a thickness of a second end of the second coating portion, and the first end of the second coating portion is closer to the first coating portion than the second end of the second coating portion is.

15 Claims, 16 Drawing Sheets

(56) References Cited

U.S. PATENT DOCUMENTS

| | | | | |
|---|---|---|---|---|
| 2018/0062090 A1* | 3/2018 | Kim | .................... | H10K 59/131 |
| 2018/0114944 A1* | 4/2018 | Son | .................... | H10K 59/131 |
| 2018/0182838 A1* | 6/2018 | Yeo | .................... | H01L 51/5253 |
| 2019/0073946 A1* | 3/2019 | Su | ....................... | H01L 27/3262 |
| 2019/0074332 A1* | 3/2019 | Kim | .................... | H01L 27/3276 |
| 2019/0096913 A1* | 3/2019 | Lee | .................... | H01L 27/1218 |
| 2019/0138127 A1 | 5/2019 | Seo et al. | | |
| 2019/0189035 A1* | 6/2019 | Ochi | .................... | H01L 51/0097 |
| 2019/0250441 A1* | 8/2019 | Hiramoto | ............ | G02F 1/13452 |
| 2019/0305073 A1* | 10/2019 | Chen | ..................... | H05K 1/028 |
| 2020/0150481 A1* | 5/2020 | You | .................. | G02F 1/133305 |
| 2020/0209916 A1* | 7/2020 | Zhang | ................... | G06F 1/1637 |
| 2021/0240226 A1* | 8/2021 | Park | ....................... | B32B 27/28 |

FOREIGN PATENT DOCUMENTS

| | | | |
|---|---|---|---|
| KR | 1020140122960 A | 10/2014 | |
| KR | 1020150094989 A | 8/2015 | |
| KR | 1020150144913 A | 12/2015 | |
| KR | 1020170026747 A | 3/2017 | |
| KR | 1020170095846 A | 8/2017 | |
| KR | 1020170109724 A | 10/2017 | |
| KR | 1020180066378 A | 6/2018 | |
| KR | 101918600 B1 | 11/2018 | |
| KR | 1020190052730 A | 5/2019 | |
| KR | 1020200123885 A | 11/2020 | |

\* cited by examiner

COVER WINDOW, METHOD OF MANUFACTURING THE SAME, AND DISPLAY DEVICE INCLUDING THE COVER WINDOW

This application claims priority to Korean Patent Application No. 10-2019-0140063, filed on Nov. 5, 2019, and all the benefits accruing therefrom under 35 U.S.C. § 119, the content of which in its entirety is herein incorporated by reference.

BACKGROUND

1. Field

Embodiments of the invention relate to a display device. More particularly, embodiments of the invention relate to a cover window, a method of manufacturing the cover window, and a display device including the cover window.

2. Description of the Related Art

Various display devices that are applied to multimedia devices, such as televisions, mobile phones, tablet computers, navigation units, and game units, are being developed. The display devices generally include a display module that displays an image and senses an external input, a polarizer disposed on the display module, and a cover window. The display module includes a display panel that displays the image and an input sensing unit that senses the external input.

In recent years, not only flat-panel display devices but also various display devices including various flexible display devices, such as a curved display device, a bendable display device, a foldable display device, a rollable display device, and a stretchable display device, are being developed.

SUMMARY

Embodiments of the invention provide a cover window capable of preventing crack initiation in a bending area and increasing rigidity thereof in a flat area.

Embodiments of the invention provide a method of manufacturing the cover window.

Embodiments of the invention provide a display device including the cover window.

An embodiment of the invention provides a cover window including a base layer including a first flat portion and a first bending portion bent from a first end of the first flat portion and a coating layer including a first coating portion disposed on the first flat portion and a second coating portion disposed on the first bending portion and having a thickness less than a thickness of the first coating portion. A first end of the second coating portion has a thickness greater than a thickness of a second end of the second coating portion, and the first end of the second coating portion is closer to the first coating portion than the second end of the second coating portion.

In another embodiment, a thickness of the coating layer may increase from the second end of the second coating portion to the first end of the second coating portion.

In another embodiment, the first coating portion may include a first sub-portion and a second sub-portion parallel to the upper surface of the first flat portion, and the first sub-portion may be inclined from the second sub-portion and is closer to the second coating portion than the second sub-portion.

In another embodiment, the second sub-portion may have a thickness greater than a thickness of the first sub-portion.

In another embodiment, the base layer may further include a second bending portion bent from a second end of the first flat portion, the coating layer may further include a third coating portion disposed on the second bending portion, and the third coating portion may have a thickness greater than the thickness of the second coating portion.

In another embodiment, the third coating portion may have a same thickness as a thickness of the second sub-portion.

In another embodiment, each of the second sub-portion and the third coating portion may have a uniform thickness.

In another embodiment, the second sub-portion may have an area greater than an area of the first sub-portion in a plan view.

In another embodiment, the base layer may further include a second flat portion spaced apart from the first flat portion, facing the first flat portion, and having a unitary shape with the first flat portion and the first bending portion, and the coating layer further may include a sub-coating portion having a thickness less than the thickness of the second coating portion and disposed on the second flat portion.

In another embodiment, the first flat portion may have an area greater than an area of the second flat portion in a plan view.

In another embodiment, the cover window may further include an auxiliary coating layer disposed on the first flat portion, and the auxiliary coating layer may non-overlap the second coating portion.

In another embodiment, each of a portion of the auxiliary coating layer adjacent to the second coating portion and the first coating portion disposed between the portion and the first flat portion may have a shape inclined from an upper surface of the first flat portion.

In another embodiment, the thickness of the first coating portion may be equal to or greater than about 20 micrometers and equal to or less than about 100 micrometers, and the thickness of the second coating portion may be equal to or greater than about 1 micrometers and equal to or less than about 20 micrometers.

An embodiment of the invention provides a method of manufacturing a cover window including preparing a base substrate in which a dummy area and an effective area are defined, defining a hole in an upper surface of the base substrate, which is adjacent to the effective area and overlaps the dummy area, providing a coating material on the base substrate overlapping the dummy area along a direction, providing the coating material on the base substrate overlapping the effective area along the direction, bending a portion of the base substrate, which is adjacent to the dummy area and overlapping the effective area, and removing a portion of the base substrate, which overlaps the dummy area. A first coating layer disposed on a flat portion of the base substrate has a thickness greater than a thickness of a second coating layer disposed on the bending portion of the base substrate.

In another embodiment, the second coating layer may include a first portion and a second portion having a thickness different from a thickness of the first portion.

In another embodiment, the method further may include forming an auxiliary coating layer on the first coating layer.

In another embodiment, the first coating layer may include a first sub-portion adjacent to the second coating layer and inclined from an upper surface of the flat portion and a second sub-portion parallel to the upper surface of the flat portion, and the second sub-portion may have a thickness greater than a thickness of the first sub-portion.

An embodiment of the invention provides a display device including a display module including a first flat area including a first display area, a bending area bent from the first flat area and including a second display area, and a second flat area including a third display area, the second flat area being spaced apart from the first flat area to face the first flat area, a cover window including a first cover portion corresponding to the first flat area, a second cover portion corresponding to the bending area, and a third cover portion corresponding to the second flat area, and an adhesive layer disposed between the display module and the cover window. The first cover portion has a thickness greater than a thickness of the second cover portion, and the thickness of the second cover portion is greater than a thickness of the third cover portion.

In another embodiment, the first cover portion may include a flat portion and an inclined portion inclined from the flat portion, the inclined portion may be disposed between the second cover portion and the flat portion, and the flat portion may have a thickness greater than a thickness of the inclined portion.

In another embodiment, the first display area may have a size greater than a size of the third display area.

By the embodiments described above, the thickness of the coating layer in the portion overlapping the flat area of the display device is different from the thickness of the coating layer in the portion overlapping the bending area of the display device. As a result, the rigidity of the flat portion of the window increases, and the crack initiation in the coating layer due to the restoration force applied to the bending portion may be prevented.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1A:
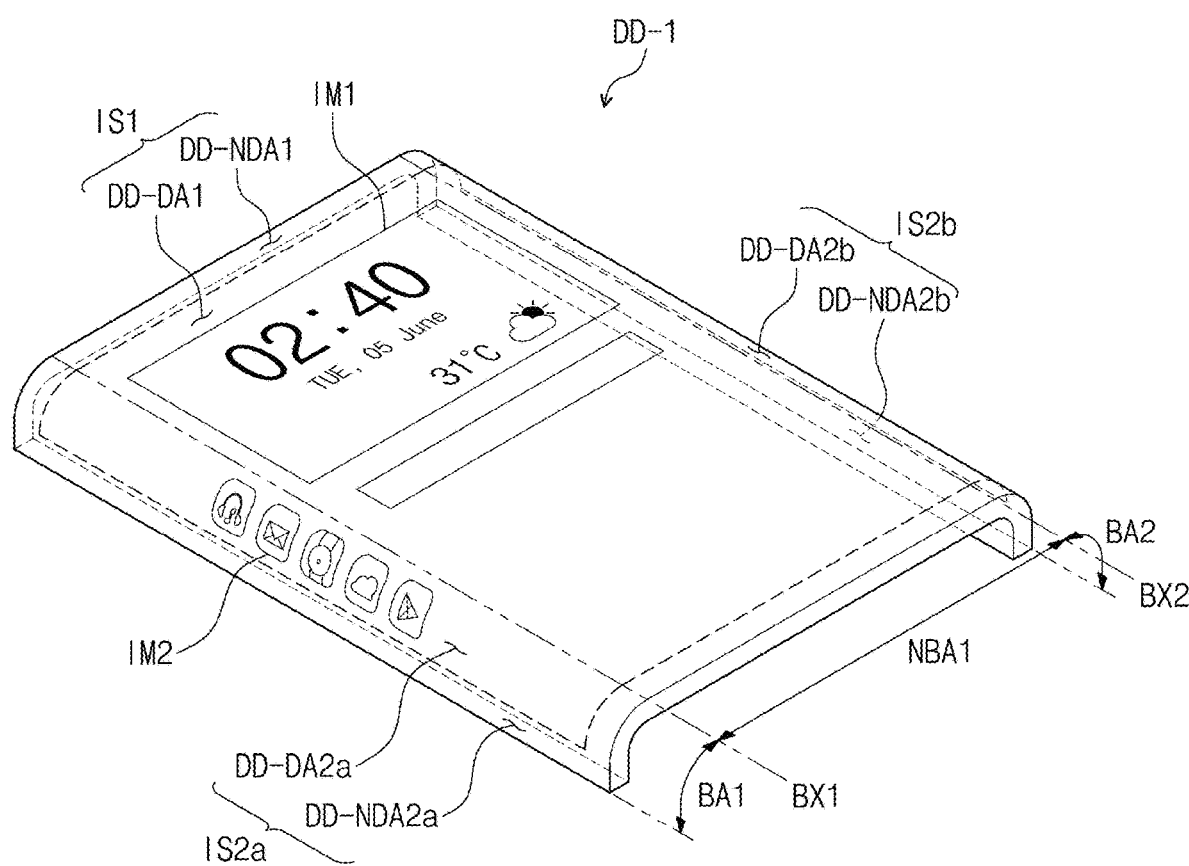
FIG. 1A is a perspective view showing an embodiment of a display device according to the invention.
Figure 1A:
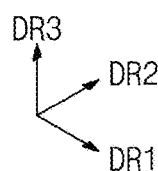

In the description, it will be understood that when an element or layer is referred to as being "on", "connected to" or "coupled to" another element or layer, it may be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the invention will be explained in detail with reference to the accompanying drawings.

Figure 1B:
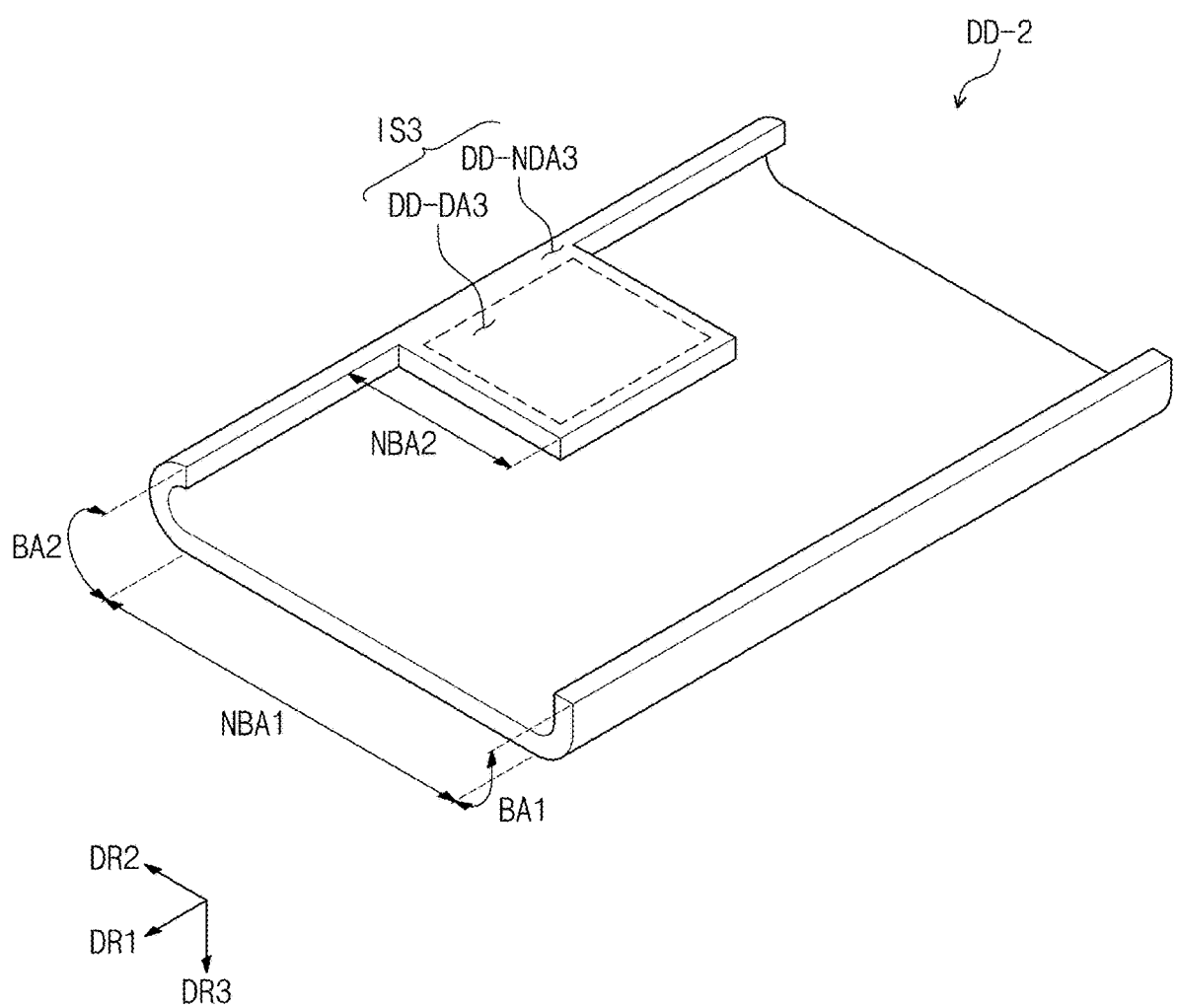
FIG. 1B is a perspective view showing an embodiment of a display device according to the invention.
Figure 1C:
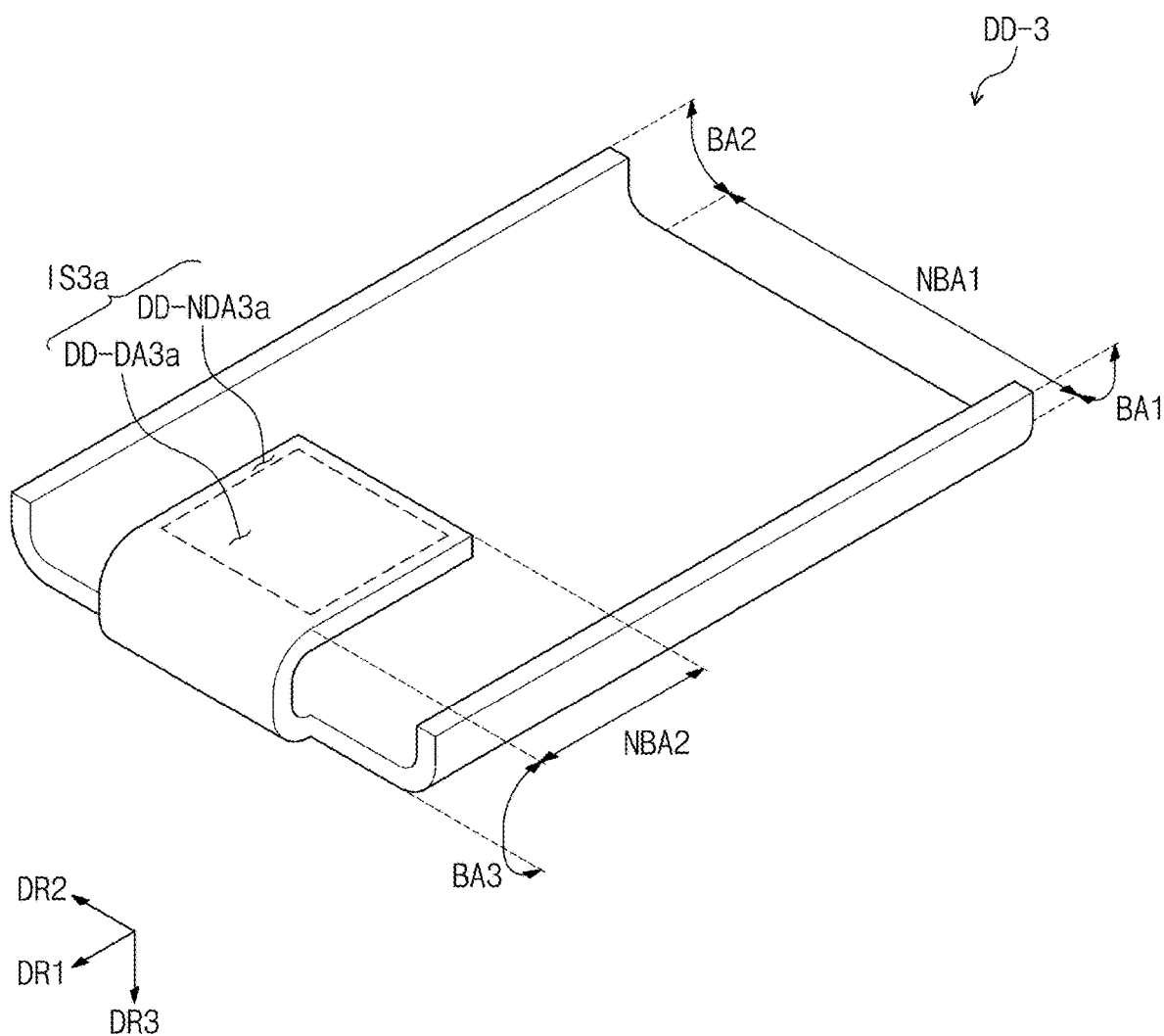
FIG. 1C is a perspective view showing an embodiment of a display device according to the invention.
Figure 1D:
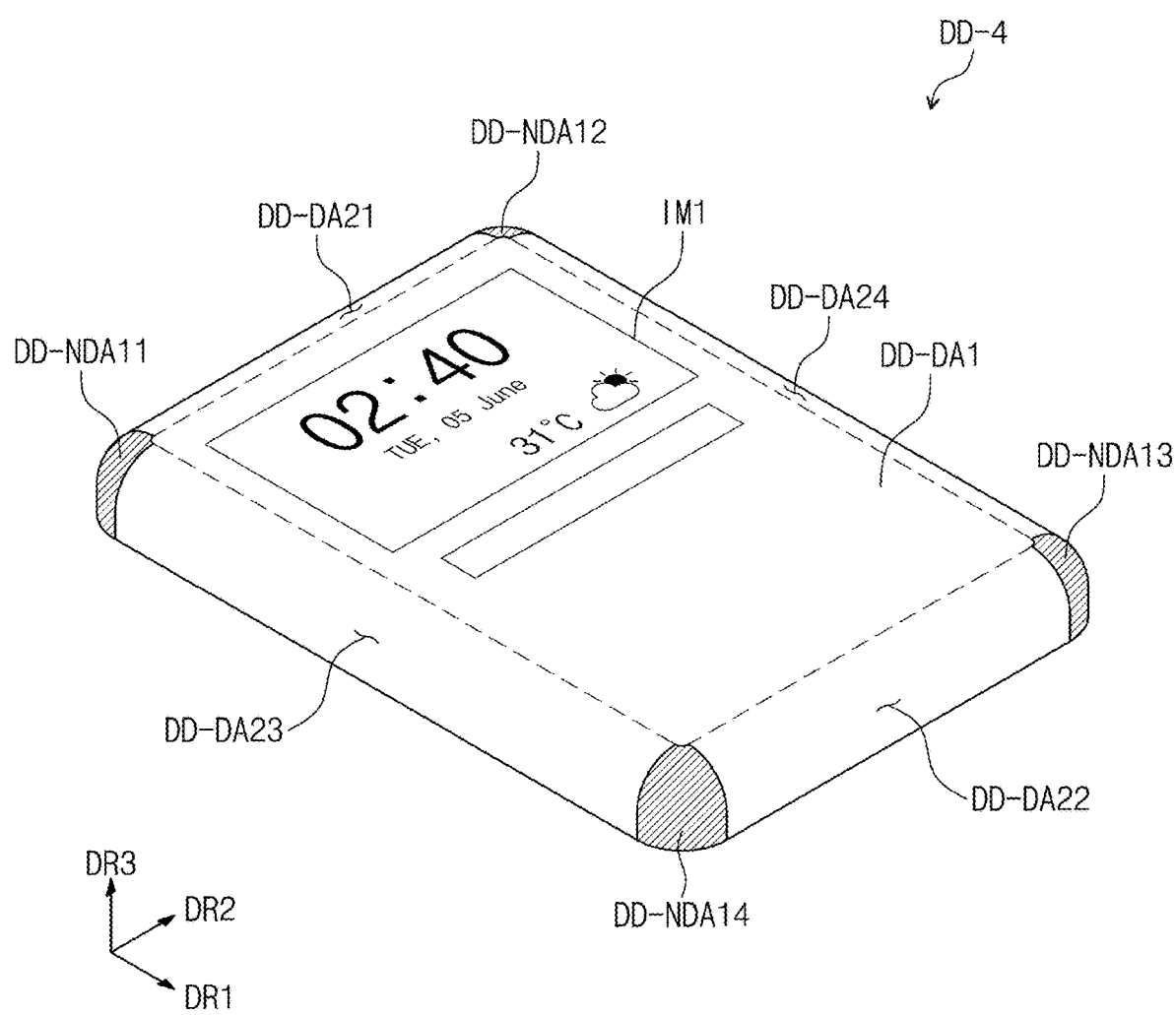
FIG. 1D is a perspective view showing an embodiment of a display device according to the invention.

FIG. 1A is a perspective view showing an embodiment of a display device DD-1 according to the invention. FIG. 1B is a perspective view showing an embodiment of a display device DD-2 according to the invention. FIG. 1C is a perspective view showing an embodiment of a display device DD-3 according to the invention. FIG. 1D is a perspective view showing an embodiment of a display device DD-4 according to the invention.

Referring to FIG. 1A, the display device DD-1 may include a first flat area NBA1, a first bending area BA1 bent from the first flat area NBA1, and a second bending area BA2 bent from the first flat area NBA1. The first bending area BA1 and the second bending area BA2 may be bent from the first flat area NBA1 to face each other. The first bending area BA1 may be bent with respect to a first bending axis BX1, and the second bending area BA2 may be bent with respect to a second bending axis BX2. The first flat area NBA1 may correspond to an upper surface of the display device DD-1, and the first bending area BA1 and the second bending area BA2 may correspond to side surfaces of the display device DD-1.

In an embodiment of the invention, the first flat area NBA1 may include a first display surface IS1, the first bending area BA1 may include a second display surface IS2a, and the second bending area BA2 may include a third display surface IS2b.

The first display surface IS1 of the first flat area NBA1 may include a first display area DD-DA1 and a first non-display area DD-NDA1 defined adjacent to the first display area DD-DA1. Hereinafter, the display area is described as an area through which an actual image is displayed, and the non-display area is described as an area through which the image is not displayed. However, the non-display area may have a variety of colors by a printed layer.

The first flat area NBA1 may be substantially parallel to a plane defined by a first direction DR1 and a second direction DR2. A third direction DR3 may indicate a normal line direction of the display device DD-1. In the following descriptions, an expression "in a plan view" may mean a case of being viewed in the third direction DR3. Hereinafter, front (or upper) and rear (or lower) surfaces of each layer or each unit are distinguished from each other by the third direction DR3. However, directions indicated by the first, second, and third directions DR1, DR2, and DR3 are relative to each other, and thus, the directions indicated by the first, second, and third directions DR1, DR2, and DR3 may be changed to other directions, e.g., opposite directions.

The second display surface IS2a of the first bending area BA1 may include a second display area DD-DA2a and a second non-display area DD-NDA2a defined adjacent to the second display area DD-DA2a. In the second direction DR2, the second display surface IS2a may be bent from one side of the first display surface IS1 with respect to the first bending axis BX1.

The third display surface IS2b of the second bending area BA2 may include a third display area DD-DA2b and a third non-display area DD-NDA2b defined adjacent to the third display area DD-DA2b. In the second direction DR2, the third display surface IS2b may be bent from an opposite side of the first display surface IS1 with respect to the second bending axis BX2.

Each of the first, second, and third display areas DD-DA1, DD-DA2a, and DD-DA2b may display the image. In an embodiment, as shown in FIG. 1A, the first display area DD-DA1 may display a first image IM1 of a clock widget, and the second display area DD-DA2a may display a second image IM2 of icons, for example. Although not shown in drawing figures, the third display area DD-DA2b may also display a third image. The first, second, and third images may be the same as each other or different from each other.

However, the concept of the invention should not be limited thereto or thereby, and the images respectively displayed through the first, second, and third display areas DD-DA1, DD-DA2a, and DD-DA2b may be connected to each other to be displayed as one image.

In addition, FIG. 1A shows the first, second, and third non-display areas DD-NDA1, DD-NDA2a, and DD-NDA2b, however, in another embodiment, at least one or all of the first, second, and third non-display areas DD-NDA1, DD-NDA2a, and DD-NDA2b may be omitted.

Referring to FIG. 1B, the display device DD-2 in an embodiment according to the invention may further include a second flat area NBA2 compared with the display device DD-1 shown in FIG. 1A. The second flat area NBA2 may be spaced apart from the first flat area NBA1 in the third direction DR3. That is, the second flat area NBA2 may be substantially parallel to the first flat area NBA1 to face the first flat area NBA1.

Particularly, the second flat area NBA2 may have a shape extending from a portion of the second bending area BA2 in the second direction DR2. As a result, one end of the second bending area BA2 may be adjacent to the first flat area NBA1, and an opposite end of the second bending area BA2 may be adjacent to the second flat area NBA2. The first flat area NBA1, the first and second bending areas BA1 and BA2, and the second flat area NBA2 may have a unitary shape.

However, the shape of the second flat area NBA2 should not be limited to the above-described shape, and the second flat area NBA2 may have a shape extending from one side of at least one of the first bending area BA1 and the second bending area BA2.

The second flat area NBA2 may include a fourth display surface IS3. The fourth display surface IS3 of the second flat area NBA2 may include a fourth display area DD-DA3 and a fourth non-display area DD-NDA3 defined adjacent to the fourth display area DD-DA3. Similarly, in another embodiment, the fourth non-display area DD-NDA3 may be omitted.

In an embodiment of the invention, the fourth display surface IS3 may have an area smaller than an area of the first display surface IS1 in a plan view. The first display surface IS1 may be viewed through the upper surface of the display device DD-1, and the fourth display surface IS3 may be viewed through a lower surface of the display device DD-2. In addition, the second display surface IS2a and the third display surface IS2b may be viewed through side surfaces of the display device DD-2. In this case, the first, second, and third display surfaces IS1, IS2a, and IS2b may be the display surfaces shown in FIG. 1A.

In an embodiment, the invention, the display device DD-2 may display different images from each other or one same image through the first, second, third, and fourth display surfaces IS1, IS2a, IS2b, and IS3. In another embodiment, the display device DD-2 may display the same image through at least two display surfaces among the first, second, third, and fourth display surfaces IS1, IS2a, IS2b, and IS3 and may display different images through the other display surfaces.

Referring to FIG. 1C, the display device DD-3 may further include a second flat area NBA2 and a third bending area BA3. The third bending area BA3 may be bent from one side of the first flat area NBA1 in the first direction DR1. As shown in FIG. 1C, the third bending area BA3 corresponds to a non-display area, however, it should not be limited thereto or thereby. That is, the third bending area BA3 may include a display area.

The second flat area NBA2 may have a shape extending from the third bending area BA3 and may be spaced apart from the first flat area NBA1 in the third direction DR3. In addition, the second flat area NBA2 may be substantially parallel to the first flat area NBA1 and may face the first flat area NBA1.

In addition, similar to the second flat area NBA2 shown in FIG. 1B, the second flat area NBA2 shown in FIG. 1C may include a fourth display surface IS3a. The fourth display surface IS3a of the second flat area NBA2 may include a fourth display area DD-DA3a and a fourth non-display area DD-NDA3a defined adjacent to the fourth display area DD-DA3. The fourth display surface IS3a may have an area smaller than an area of the first display surface IS1 (refer to FIG. 1A) in a plan view.

Referring to FIG. 1D, the display device DD-4 may include a main display area DD-DA1 and first, second, third, and fourth display areas DD-DA21, DD-DA22, DD-DA23, and DD-DA24 bent from the main display area DD-DA1. The main display area DD-DA1 may correspond to an upper surface of the display device DD-4, and the first, second, third, and fourth display areas DD-DA21, DD-DA22, DD-DA23, and DD-DA24 may correspond to side surfaces of the display device DD-4.

The first display area DD-DA21 and the second display area DD-DA22 may face each other in the first direction DR1 and may be respectively bent from one side and an opposite side of the main display area DD-DA1 in the first direction DR1. The third display area DD-DA23 and the fourth display area DD-DA24 may face each other in the second direction DR2 and may be respectively bent from one side and an opposite side of the main display area DD-DA1 in the second direction DR2.

In addition, the display device DD-4 may include first, second, third, and fourth non-display areas DD-NDA11, DD-NDA12, DD-NDA13, and DD-NDA14. The first, second, third, and fourth non-display areas DD-NDA11, DD-NDA12, DD-NDA13, and DD-NDA14 may correspond to side surfaces of the display device DD-4.

The first non-display area DD-NDA11 may be disposed between the first display area DD-DA21 and the third display area DD-DA23. The second non-display area DD-NDA12 may be disposed between the first display area DD-DA21 and the fourth display area DD-DA24. The third non-display area DD-NDA13 may be disposed between the second display area DD-DA22 and the fourth display area DD-DA24. The fourth non-display area DD-NDA14 may be disposed between the second display area DD-DA22 and the third display area DD-DA23.

In the embodiment of the invention, the main display area DD-DA1 may have a plane shape substantially parallel to a plane defined by the first direction DR1 and the second direction DR2. The first, second, third, and fourth display areas DD-DA21, DD-DA22, DD-DA23, and DD-DA24 and the first, second, third, and fourth non-display areas DD-NDA11, DD-NDA12, DD-NDA13, and DD-NDA14 may have a curved shape bent from the main display area DD-DA1.

In addition, although not shown in drawing figures, the display device DD-4 shown in FIG. 1D may further include the fourth display surface shown in FIG. 1B or 1C.

Figure 2A:
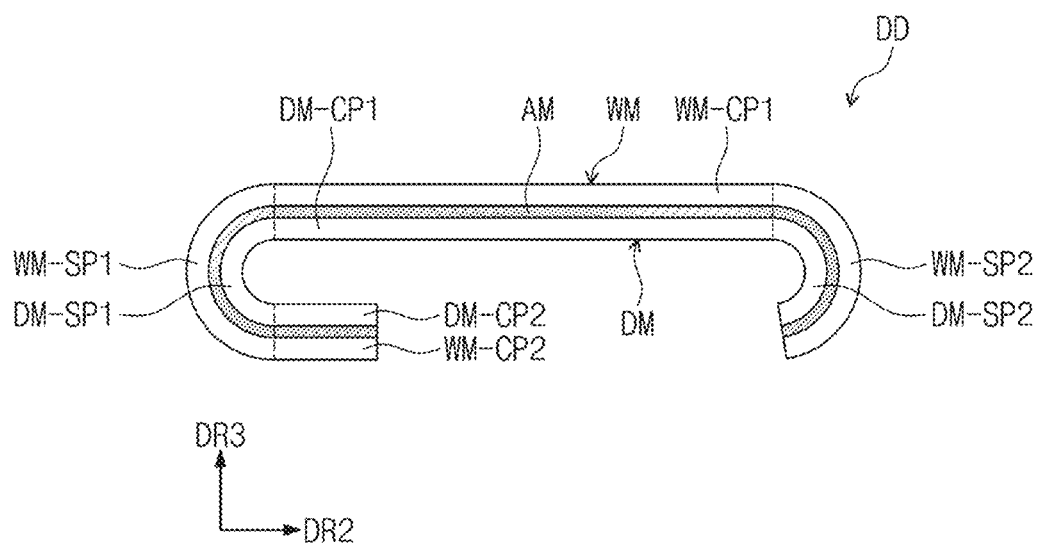
FIG. 2A is a cross-sectional view showing an embodiment of a display device according to the invention.
Figure 2B:
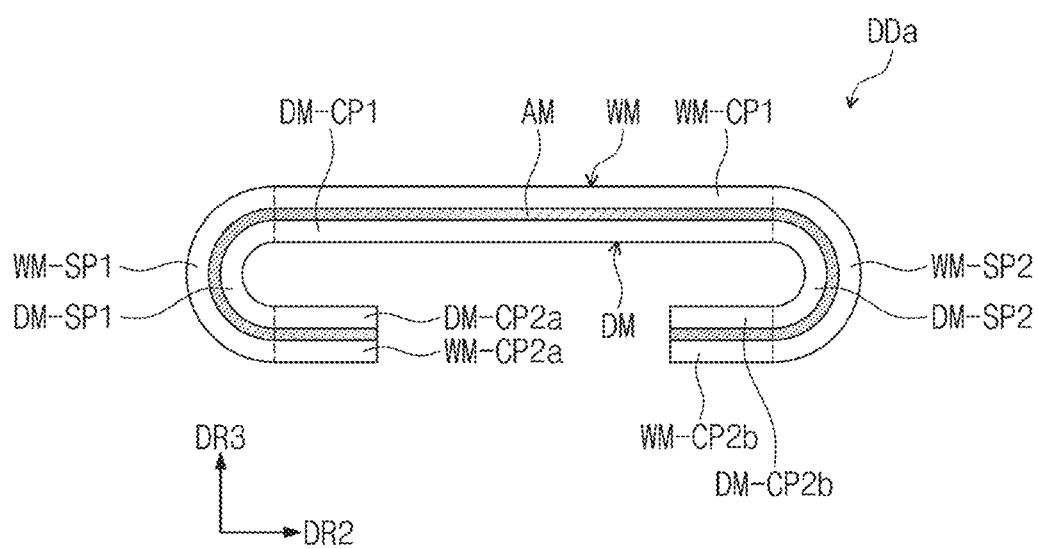
FIG. 2B is a cross-sectional view showing an embodiment of a display device according to the invention.

FIG. 2A is a cross-sectional view showing an embodiment of a display device DD according to the invention. FIG. 2B is a cross-sectional view showing an embodiment of a display device DDa according to the invention.

Referring to FIG. 2A, the display device DD may include a window WM, a display module DM, and an adhesive layer AM. The display device DD shown in FIG. 2A may correspond to the display device DD-2 shown in FIG. 1B.

The window WM may be attached to an upper surface of the adhesive layer AM. The window WM may be a component in which the image is actually viewed from the outside. In the descriptions, the window WM may define an upper surface of the display device DD and may be a cover window that covers the display module DM.

The display module DM may be disposed on the window WM. The display module DM may output the image or may sense an external input. In an embodiment of the invention, the display module DM may be a flexible display substrate that is able to be bent or curved.

The adhesive layer AM may be disposed between the window WM and the display module DM. The adhesive layer AM may be a double-sided adhesive and may fix the window WM and the display module DM. In an embodiment, the adhesive layer AM may be an optically clear adhesive ("OCA") film, an optically clear resin ("OCR"), or a pressure sensitive adhesive ("PSA") film, for example. Hereinafter, in the descriptions, the OCA film will be described as a representative example of the adhesive layer AM.

In the embodiment of the invention, the window WM may include a first flat portion WM-CP1, a second flat portion WM-CP2, a first bending portion WM-SP1, and a second bending portion WM-SP2. The first bending portion WM-SP1 and the second bending portion WM-SP2 may be respectively bent from one end (e.g., left end) and an opposite end (e.g., right end) of the first flat portion WM-CP1 and may face each other in the second direction DR2. In the descriptions, the first flat portion WM-CP1 may be described as a first cover portion, the first bending portion WM-SP1 or the second bending portion WM-SP2 may be described as a second cover portion, and the second flat portion WM-CP2 may be described as a third cover portion.

As shown in FIG. 2A, the first bending portion WM-SP1 and the second bending portion WM-SP2 may have different shapes from each other. In an embodiment, the first bending portion WM-SP1 bent from the one end of the first flat portion WM-CP1 may have a length longer than a length of the second bending portion WM-SP2 bent from the opposite end of the first flat portion WM-CP1, for example, however, it should not be limited thereto or thereby. In another embodiment, the shape of the first bending portion WM-SP1 may be symmetrical with the shape of the second bending portion WM-SP2 with respect to the first flat portion WM-CP1.

In an embodiment of the invention, each of an angle between the first bending portion WM-SP1 and the first flat portion WM-CP1 and an angle between the second bending portion WM-SP2 and the first flat portion WM-CP1 may be equal to or greater than about 90 degrees, however, the angle should not be limited thereto or thereby. The angle between the bending portion and the flat portion of the window may be changed in various ways.

The second flat portion WM-CP2 may have an area smaller than an area of the first flat portion WM-CP1 in a plan view and may be spaced apart from the first flat portion WM-CP1 in the third direction DR3. The second flat portion WM-CP2 may be substantially parallel to the first flat portion WM-CP1 and may face the first flat portion WM-CP1. One end (e.g., upper end) of the first bending portion WM-SP1 may be adjacent to the one end (e.g., left end) of the first flat portion WM-CP1, and an opposite end (e.g., lower end) of the first bending portion WM-SP1 may be adjacent to the second flat portion WM-CP2.

In addition, the first flat portion WM-CP1 of the window WM may correspond to the first flat area NBA1 shown in FIG. 1A, and the first and second bending portions WM-SP1 and WM-SP2 may respectively correspond to the first and second bending areas BA1 and BA2. In addition, the second flat portion WM-CP2 of the window WM may correspond to the second flat area NBA2 shown in FIG. 1B.

In an embodiment of the invention, the window WM may be defined as one component in which the first flat portion WM-CP1, the second flat portion WM-CP2, the first bending portion WM-SP1, and the second bending portion WM-SP2 are unitary with each other.

The display module DM may include a first center portion DM-CP1, a second center portion DM-CP2, a first edge portion DM-SP1, and a second edge portion DM-SP2.

The first center portion DM-CP1 may be disposed on the first flat portion WM-CP1. The first edge portion DM-SP1 and the second edge portion DM-SP2 may be respectively disposed on the first bending portion WM-SP1 and the second bending portion WM-SP2. The second center portion DM-CP2 may be disposed on the second flat portion WM-CP2.

Similarly, the display module DM may be defined as one component in which the first center portion DM-CP1, the second center portion DM-CP2, the first edge portion DM-SP1, and the second edge portion DM-SP2 are unitary with each other.

Referring to FIG. 2B, the display device DDa may have a structure in which the shapes of portions of the display module DM and the window WM are changed when compared with the display device DD described with reference to FIG. 2A.

In detail, the window WM may include a first flat portion WM-CP1, a second flat portion WM-CP2a, a third flat portion WM-CP2b, a first bending portion WM-SP1, and a second bending portion WM-SP2. The third flat portion WM-CP2b of the window WM shown in FIG. 2B is a component that is added when compared with the window WM shown in FIG. 2A. In addition, the first bending portion WM-SP1 and the second bending portion WM-SP2 of the window WM shown in FIG. 2B may be respectively bent from one end and an opposite end of the first flat portion WM-CP1 and may have symmetrical shapes with respect to the first flat portion WM-CP1.

The third flat portion WM-CP2b may have an area smaller than an area of the first flat portion WM-CP1 in a plan view and may be spaced apart from the first flat portion WM-CP1 and the second flat portion WM-CP2a. The third flat portion WM-CP2b may be substantially parallel to the first flat portion WM-CP1 and may face the first flat portion WM-CP1. One end (e.g., upper end) of the second bending portion WM-SP2 may be adjacent to the opposite end (e.g., right end) of the first flat portion WM-CP1, and an opposite end (e.g., lower end) of the second bending portion WM-SP2 may be adjacent to the third flat portion WM-CP2b.

The display module DM may include a first center portion DM-CP1, a second center portion DM-CP2a, a third center portion DM-CP2b, a first edge portion DM-SP1, and a second edge portion DM-SP2. The third center portion DM-CP2b of the display module DM shown in FIG. 2B is a component that is added when compared with the display module DM shown in FIG. 2A. The third center portion DM-CP2b may be disposed on the third flat portion WM-CP2b.

Figure 3A:
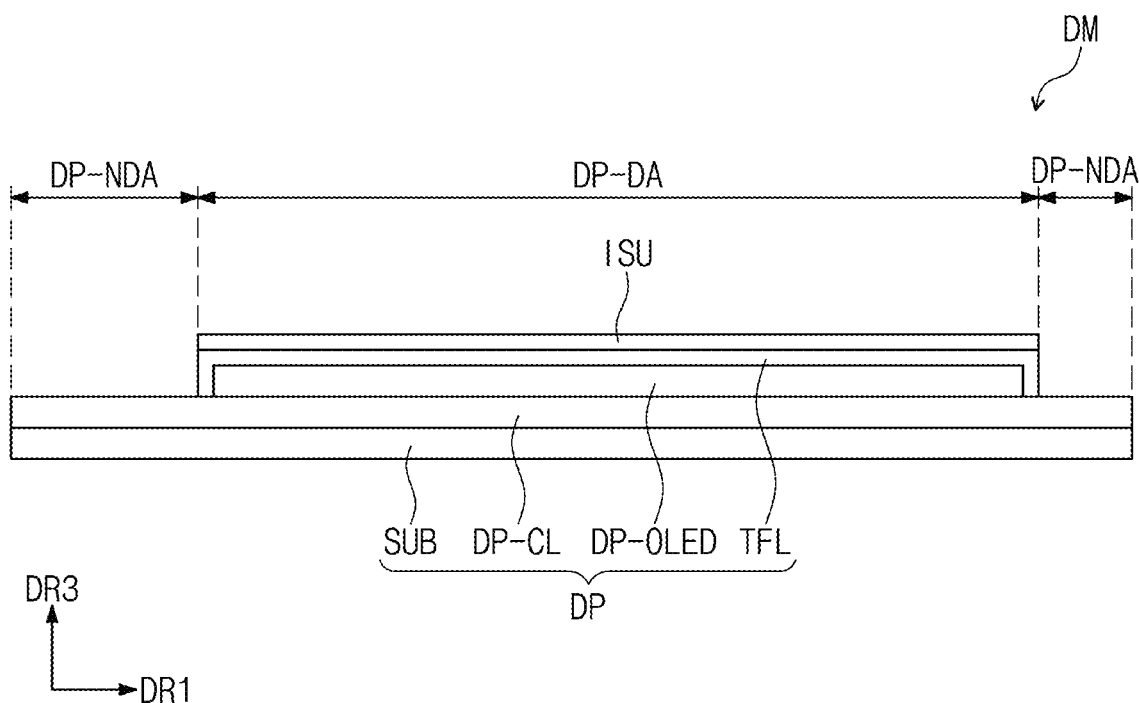
FIG. 3A is a cross-sectional view showing an embodiment of a display module according to the invention.
Figure 3B:
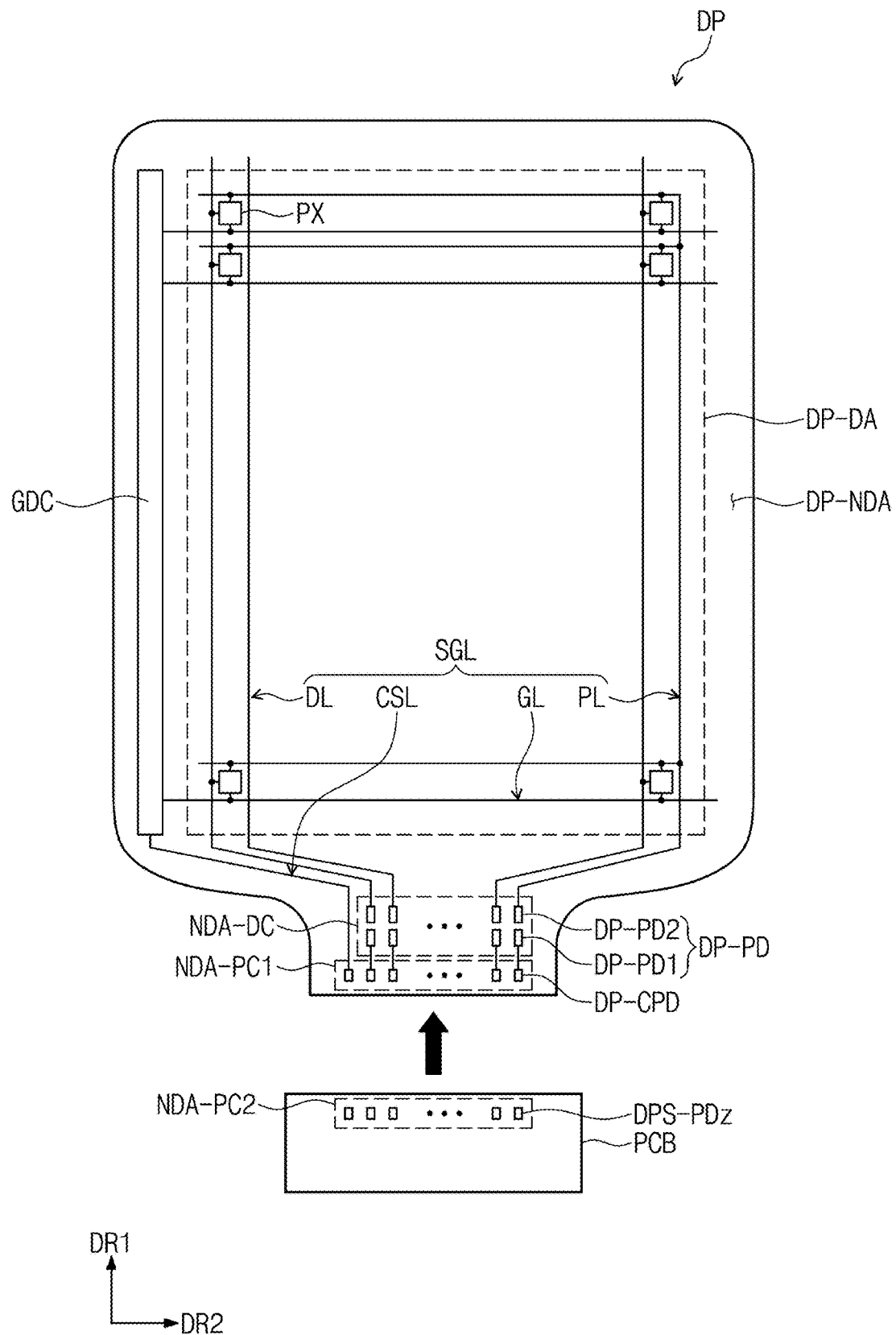
FIG. 3B is a plan view showing an embodiment of a display device according to the invention.

FIG. 3A is a cross-sectional view showing an embodiment of a display module DM according to the invention. FIG. 3B is a plan view showing an embodiment of a display panel DP according to the invention.

The display panel DP may include a substrate SUB, a circuit element layer DP-CL, a display element layer DP-OLED, and an insulating layer TFL, which are sequentially disposed on the substrate SUB. A type of the display panel should not be particularly limited. In an embodiment, the display panel may be an organic light emitting display panel or a quantum dot light emitting display panel, for example. In an embodiment, a light emitting layer of the organic light emitting display panel may include an organic light emitting material. In an embodiment, a light emitting layer of the quantum dot light emitting display panel may include a quantum dot or a quantum rod.

The display panel DP may include a display area DP-DA and a non-display area DP-NDA. The display area DP-DA of the display panel DP may correspond to the display areas shown in FIG. 1A, and the non-display area DP-NDA of the display panel DP may correspond to the non-display areas shown in FIG. 1A.

The substrate SUB may include at least one plastic film. In an embodiment, the substrate SUB may include a plastic substrate, a glass substrate, a metal substrate, or an organic/inorganic composite substrate as a flexible substrate, for example.

The circuit element layer DP-CL may include at least one intermediate insulating layer and a circuit element. The intermediate insulating layer may include at least one intermediate inorganic layer and at least one intermediate organic layer. The circuit element may include signal lines and a pixel driving circuit.

The display element layer DP-OLED may include a plurality of organic light emitting diodes. The display element layer DP-OLED may further include an organic layer such as a pixel definition layer. According to another embodiment, when the liquid crystal display panel is provided as the display panel, the display element layer may be a liquid crystal layer.

The insulating layer TFL may encapsulate the display element layer DP-OLED. In an embodiment, the insulating layer TFL may be a thin film encapsulation layer, for example. The insulating layer TFL may protect the display element layer DP-OLED from moisture, oxygen, and a foreign substance such as dust particles, however, it should not be limited thereto or thereby. An encapsulation substrate may be used instead of the insulating layer TFL. In this case, the encapsulation substrate may face the substrate SUB, and the circuit element layer DP-CL and the display element layer DP-OLED may be disposed between the encapsulation substrate and the substrate SUB.

An input sensing layer ISU may be disposed between the window WM and the display panel DP. The input sensing layer ISU may sense an input applied from the outside. The input applied from the outside may be provided in various forms. In an embodiment, the external input may include various forms of inputs, such as a part of the user's body, a stylus pen, light, heat, or pressure. Also, in addition to an input by contacting a part of user's body, such as a user's hand, an input in proximity to or approaching to a surface (e.g., hovering) may be a form of the external input.

The input sensing layer ISU may be disposed directly on the display panel DP. In the description, the expression "component "A" is directly disposed on component "B"" means that no intervening elements, such as an adhesive layer, are between the component "A" and the component "B". The input sensing layer ISU may be provided together with the display panel DP through successive processes. However, the concept of the invention should not be limited thereto or thereby. The input sensing layer ISU may be coupled to the display panel DP by an adhesive layer after being provided as a separate panel. In another embodiment, the input sensing layer ISU may be omitted.

In addition, although not shown in drawing figures, an auxiliary insulating layer may be further disposed between the input sensing layer ISU and the insulating layer TFL. In an embodiment, the auxiliary insulating layer may be an inorganic layer, for example. In this case, some of conductive patterns included in the input sensing layer ISU may be disposed directly on the auxiliary insulating layer.

Referring to FIG. 3B, the display panel DP may include a driving circuit GDC, a plurality of signal lines SGL, a plurality of signal pads DP-PD, a plurality of connection signal pads DP-CPD, and a plurality of pixels PX. The pixels PX may be arranged in the display area DP-DA. Each of the pixels may include the organic light emitting diode and the pixel driving circuit connected to the organic light emitting diode. The driving circuit GDC, the signal lines SGL, the signal pads DP-PD, the connection signal pads DP-CPD, and the pixel driving circuit may be included in the circuit element layer DP-CL shown in FIG. 3A.

The display panel DP may be described as a display substrate, and the display substrate may include the substrate SUB, the signal pads DP-PD disposed on the substrate SUB, and the connection signal pads DP-CPD disposed on the substrate SUB.

The driving circuit GDC may sequentially output gate signals to gate lines GL. The driving circuit GDC may further output another control signal to the pixels PX. The driving circuit GDC may include a plurality of thin film transistors provided through the same processes, e.g., a low temperature polycrystalline silicon ("LTPS") process or a low temperature polycrystalline oxide ("LTPO") process, as the pixel driving circuit of the pixels PX.

The signal lines SGL may include the gate lines GL, data lines DL, a power line PL, and a control signal line CSL. Each of the gate lines GL may be connected to a corresponding pixel among the pixels PX, and each of the data lines DL may be connected to a corresponding pixel among the pixels PX. The power line PL may be connected to the pixels PX. The control signal line CSL may provide the control signals to the driving circuit GDC.

The signal lines SGL may overlap the display area DP-DA and the non-display area DP-NDA. Each of the signal lines SGL may include a pad portion and a line portion. The line portion may overlap the display area DP-DA and the non-display area DP-NDA. The pad portion may be connected to an end of the line portion. The pad portion may be disposed in the non-display area DP-NDA and may overlap a corresponding signal pad among the signal pads DP-PD.

Hereinafter, an area in which the signal pads DP-PD are arranged in the non-display area DP-NDA may be referred to as a "chip area NDA-DC", and an area in which the connection signal pads DP-CPD are arranged in the non-display area DP-NDA may be referred to as a "first pad area NDA-PC1".

In an embodiment, a driving chip may be disposed (e.g., mounted) on the chip area NDA-DC. The signal pads DP-PD may be electrically connected to the driving chip to transmit electrical signals provided from the driving chip to the signal lines SGL.

In detail, the signal pads DP-PD may include first row signal pads DP-PD1 arranged in a first row along the first direction DR1 and second row signal pads DP-PD2 arranged in a second row along the first direction DR1.

A portion of a circuit board PCB may be disposed in the first pad area NDA-PC1. The connection signal pads DP-CPD may be electrically connected to the circuit board PCB and may transmit electrical signals from the circuit board PCB to the signal pads DP-PD. The circuit board PCB may be rigid or flexible. In an embodiment, when the circuit board PCB is flexible, a flexible printed circuit board may be provided as the circuit board PCB, for example.

The circuit board PCB may include a timing control circuit that controls an operation of the display panel DP. The timing control circuit may be disposed (e.g., mounted) on the circuit board PCB in the form of an integrated chip. In addition, although not shown in drawing figures, the circuit board PCB may include an input sensing circuit that controls the input sensing layer ISU.

The circuit board PCB may include driving pads DPS-PDz electrically connected to the display panel DP. The driving pads DPS-PDz may be disposed in a second pad area NDA-PC2 defined in the circuit board PCB.

Figure 4:
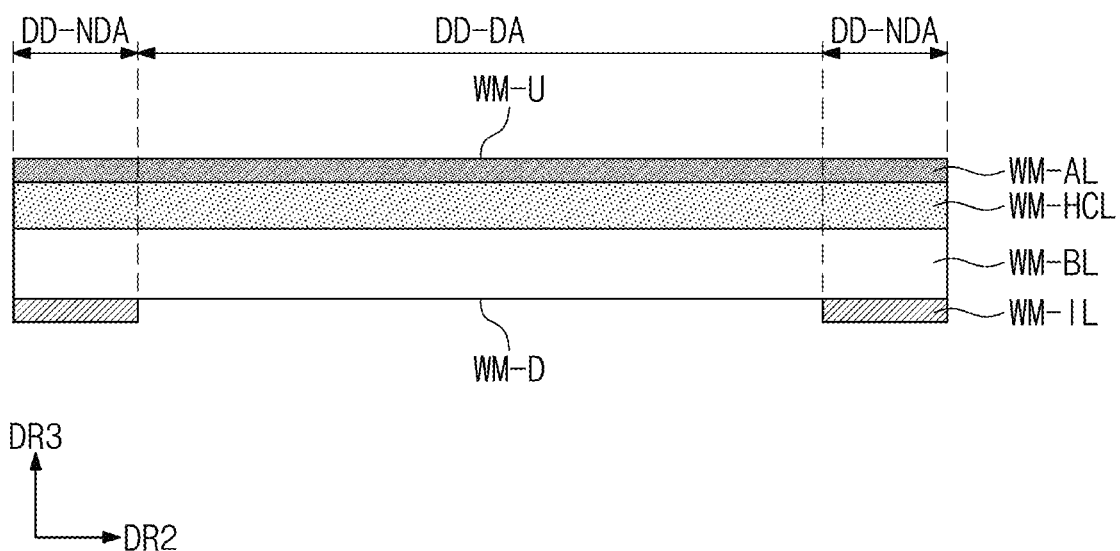
FIG. 4 is a cross-sectional view showing an embodiment of a cover window according to the invention.
Figure 5:
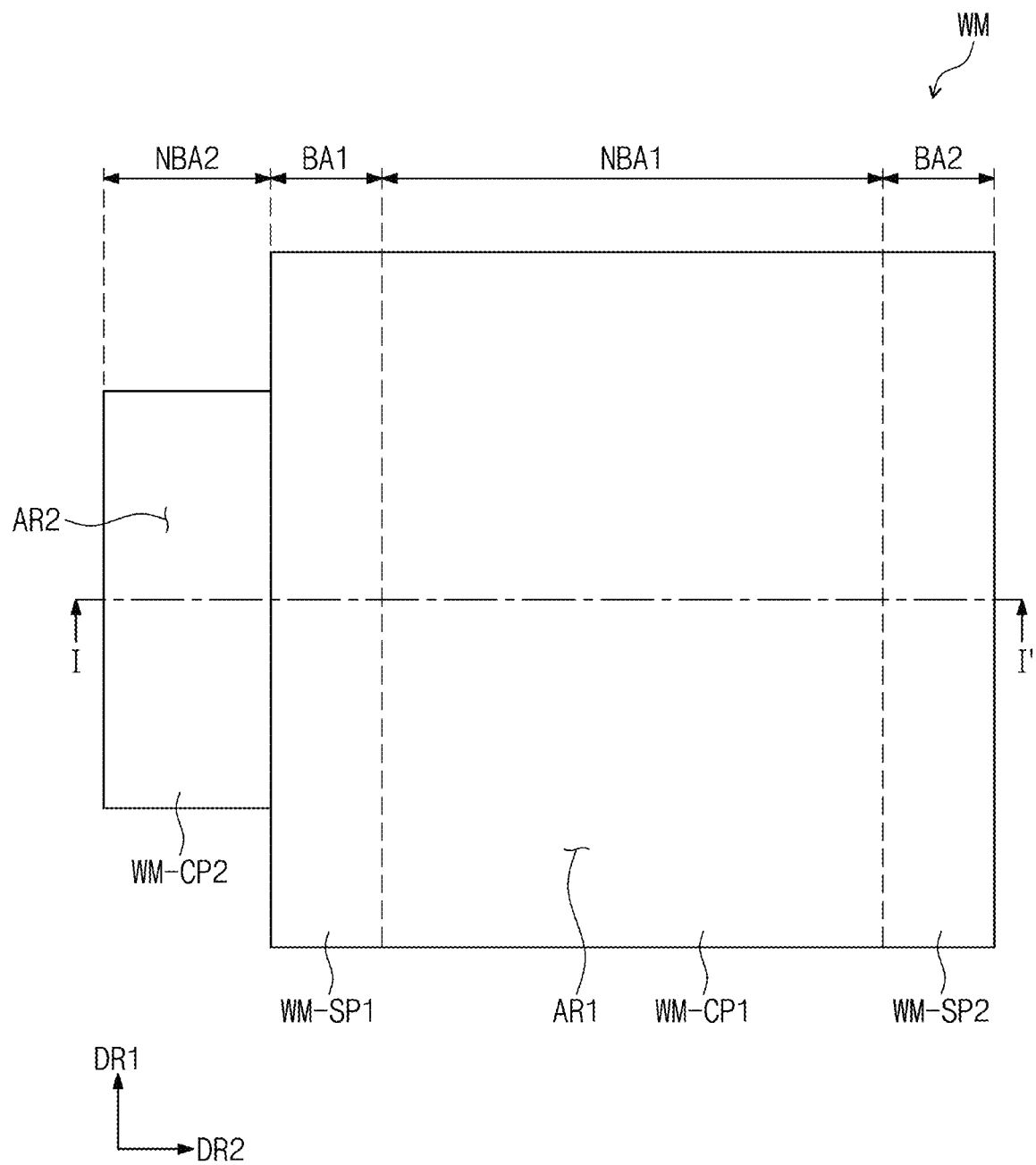
FIG. 5 is a plan view showing an embodiment of a cover window according to the invention.

FIG. 4 is a cross-sectional view showing an embodiment of a cover window according to the invention. FIG. 5 is a plan view showing an embodiment of a cover window according to the invention.

Referring to FIG. 4, a window WM may include a base layer WM-BL, a coating layer WM-HCL, an auxiliary coating layer WM-AL, and a printed layer WM-IL.

The base layer WM-BL may generally support components of the window WM. In an embodiment of the invention, the base layer WM-BL may include a transparent plastic film or an organic/inorganic composite substrate. In an embodiment, the base layer may have a stacked structure of a plurality of insulating layers. In an embodiment, the plastic base layer may include at least one of acrylic-based resin, methacrylic-based resin, polyisoprene, vinyl-based resin, epoxy-based resin, urethane-based resin, cellulose-based resin, siloxane-based resin, polyimide-based resin, polyamide-based resin, and perylene-based resin, for example. That is, the base layer WM-BL may include materials having superior optical characteristics, mechanical strength, flexibility, and elastic recovery.

The coating layer WM-HCL may be disposed on the base layer WM-BL. The coating layer WM-HCL may increase an overall rigidity of the window WM. The coating layer WM-HCL may be disposed on a front surface of the base layer WM-BL by at least one of a dipping coating, spin coating, spray coating, or vacuum deposition method, for example. In an embodiment, the coating layer WM-HCL may include an organic compound or an organic/inorganic composite compound, for example. The organic compound may include an acrylic-based compound, an epoxy-based compound, or a combination thereof, and the organic/inorganic composite compound may include a silicon compound.

The first bending portion WM-SP1 or the second bending portion WM-SP2 bent from the first flat portion WM-CP1 shown in FIG. 2A may have a force of restoration. In particular, as a thickness of the coating layer WM-HCL overlapping the first bending portion WM-SP1 or the second bending portion WM-SP2 increases, the restoration force acting on the first and second bending portions WM-SP1 and WM-SP2 may increase.

In the embodiment of the invention, the coating layer WM-HCL may have different thicknesses depending on its portions and may be disposed on the base layer WM-BL. In an embodiment, the thickness of the coating layer WM-HCL overlapping the first flat portion WM-CP1 may be greater than the thickness of the coating layer WM-HCL overlapping the first bending portion WM-SP1, for example. As a result, the restoration force applied to the first bending portion WM-SP1 may decrease.

In the embodiment described above, as the thickness of the portion of the coating layer WM-HCL overlapping the flat area of the display device DD is different from the thickness of the portion of the coating layer WM-HCL overlapping the bending area of the display device DD, the rigidity of the flat portion of the window WM may increase, and thus, a crack generation in the coating layer WM-HCL due to the restoration force applied to the bending portion may be prevented.

The auxiliary coating layer WM-AL may be disposed on the coating layer WM-HCL. The auxiliary coating layer WM-AL may include at least one of an anti-finger coating layer, an anti-reflection coating layer, and an anti-glare coating layer.

In an embodiment, an upper surface of the auxiliary coating layer WM-AL may define an upper surface WM-U of the window WM, and a lower surface of the base layer WM-BL may define a lower surface WM-D of the window WM.

The printed layer WM-IL may be disposed on the lower surface of the base layer WM-BL to overlap the non-display area DD-NDA of the display device DD. The printed layer WM-IL may include at least one printed layer and may have various colors. However, in the case of a display device DD from which the non-display area DD-NDA is omitted, the printed layer WM-IL may be omitted as well. In this case, the upper surface WM-U of the window WM, which defines the upper surface of the display device DD, may correspond to the display area DD-DA as a whole.

Referring to FIG. 5, the window WM before being molded is shown. That is, the window WM shown in FIG. 5 may have a shape before the first bending portion WM-SP1 of the window WM corresponding to the first bending area BA1 and the second bending portion WM-SP2 of the window WM corresponding to the second bending area BA2 are bent.

In an embodiment of the invention, an area AR1 of the first flat portion WM-CP1 that defines the upper surface of the window WM may be greater than an area AR2 of the second flat portion WM-CP2 that defines the lower surface of the window WM. The first flat portion WM-CP1 may display the image through a front surface of the display device DD, and the second flat portion WM-CP2 may display the image through a rear surface of the display device DD.

Figure 6A:
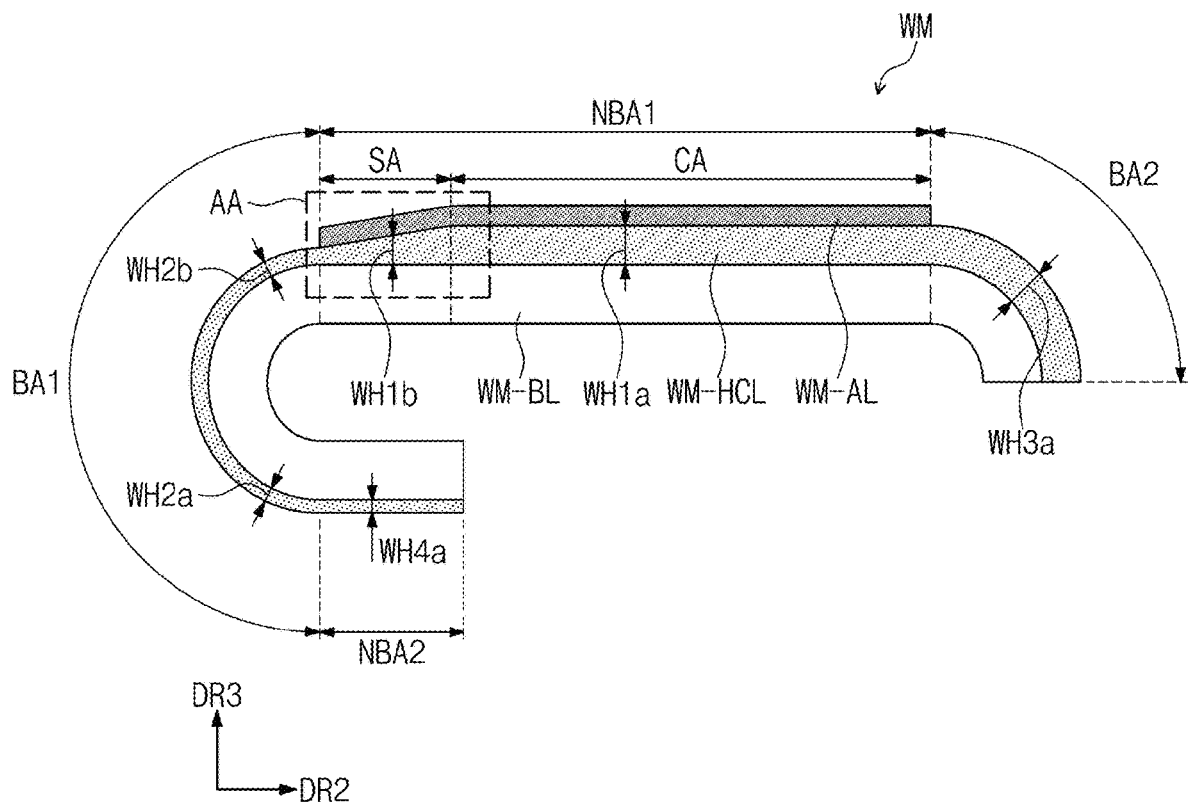
FIG. 6A is a cross-sectional view showing an embodiment of a cover window of FIG. 5 taken along line I-I' according to the invention.
Figure 6B:
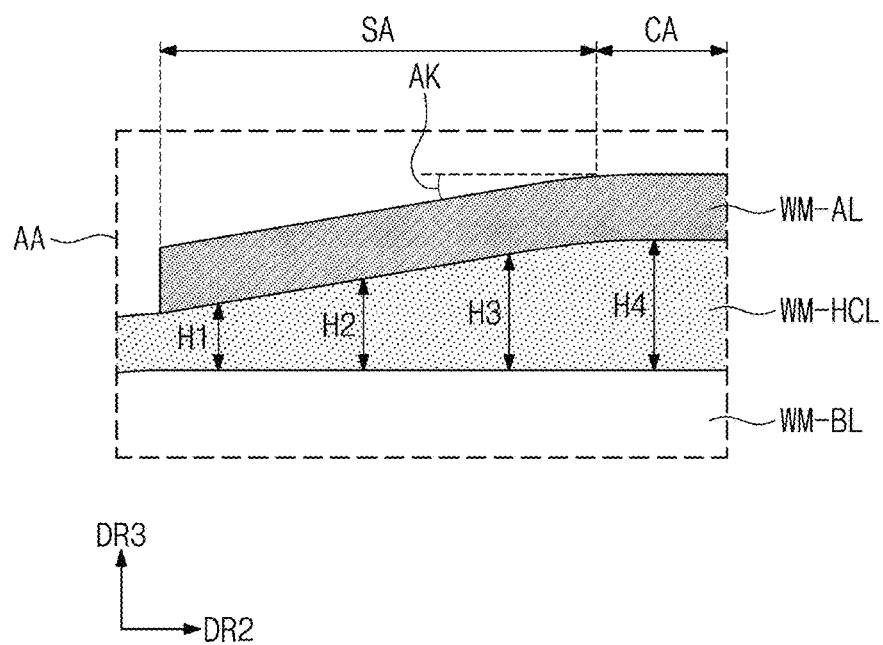
FIG. 6B is an enlarged view showing an area AA shown in FIG. 6A.

FIG. 6A is a cross-sectional view showing an embodiment of a cover window of FIG. 5 taken along line I-I' according to the invention. FIG. 6B is an enlarged view showing an area AA shown in FIG. 6A.

Referring to FIG. 6A, a window WM may define the first flat area NBA1, the second flat area NBA2, the first bending area BA1, and the second bending area BA2. Each of the base layer WM-BL and the coating layer WM-HCL may define areas respectively corresponding to the first flat area NBA1, the second flat area NBA2, the first bending area BA1, and the second bending area BA2.

The base layer WM-BL may have a uniform thickness as a whole. The thickness of the base layer WM-BL in each of the first flat area NBA1, the second flat area NBA2, the first bending area BA1, and the second bending area BA2 may be uniform. In an embodiment, the base layer WM-BL may be defined by a first flat portion, a second flat portion, a first bending portion, and a second bending portion, which have a unitary shape.

The first flat portion may correspond to the first flat area NBA1, and the second flat portion may correspond to the second flat area NBA2. The first bending portion may correspond to the first bending area BA1, and the second bending portion may correspond to the second bending area BA2.

The coating layer WM-HCL may be defined by a first coating portion, a second coating portion, a third coating portion, and a sub-coating portion, which have a unitary shape.

The first coating portion may be disposed on the first flat portion corresponding to the first flat area NBA1. The second coating portion may be disposed on the first bending portion corresponding to the first bending area BA1. The third coating portion may be disposed on the second bending portion corresponding to the second bending area BA2. The sub-coating portion may be disposed on the second flat portion corresponding to the second flat area NBA2. FIG. 6A shows the sub-coating portion corresponding to the second flat area NBA2, however, the sub-coating portion may be omitted in another embodiment.

In an embodiment, the first coating portion overlapping the first flat area NBA1 may have a thickness equal to or greater than about 20 micrometers and equal to or less than about 100 micrometers, for example. In an embodiment, the second coating portion overlapping the first bending area BA1 may have a thickness equal to or greater than about 1 micrometers and equal to or less than about 20 micrometers, for example.

In the embodiment, the first coating portion of the coating layer WM-HCL overlapping the first flat area NBA1 may include a first sub-portion SA inclined from the first flat portion of the base layer WM-BL and a second sub-portion CA parallel to the first flat portion. In particular, the first sub-portion SA may be closer to the second coating portion of the coating layer WM-HCL than the second sub-portion CA is. That is, a distance between the first sub-portion SA and the second coating portion of the coating layer WM-HCL may be shorter than a distance between the second sub-portion CA and the second coating portion of the coating layer WM-HCL.

The second sub-portion CA may have a thickness WH1$a$ greater than a thickness WH1$b$ of the first sub-portion SA. In particular, the first sub-portion SA according to the invention may not have the uniform thickness but may have different thicknesses depending on its position. In addition, the second sub-portion CA may have an area greater than an area of the first sub-portion SA in a plan view. As shown in FIG. 6A, a length in the second direction DR2 of the second sub-portion CA may be longer than a length of the first sub-portion SA in the second direction DR2.

Referring to FIG. 6B, the first sub-portion SA may define a first angle AK with a plane parallel to the upper surface of the base layer WM-BL. Particularly, as described above, the thickness WH1b of the first sub-portion SA may have first, second, and third heights H1, H2, and H3 that increase from one end (e.g., upper end) of the first flat portion. The second sub-portion CA may have a uniform thickness as a whole. The thickness of the second sub-portion CA may be defined by a fourth height H4. In an embodiment of the invention, the fourth height H4 defining the thickness of the second sub-portion CA may greater than the first, second, and third heights H1, H2, and H3.

In an embodiment of the invention, a portion of the auxiliary coating layer WM-AL overlapping the first sub-portion SA may be inclined at the same slope as a slope of the first sub-portion SA. However, the portion of the auxiliary coating layer WM-AL overlapping the first sub-portion SA may have a uniform thickness. Another portion of the auxiliary coating layer WM-AL overlapping the second sub-portion CA may be substantially parallel to the second sub-portion CA and may have the same thickness as a thickness of the portion of the auxiliary coating layer WM-AL overlapping the first sub-portion SA.

In addition, the auxiliary coating layer WM-AL may be disposed on the coating layer WM-HCL overlapping the first flat area NBA1. That is, the auxiliary coating layer WM-AL may not overlap the coating layer WM-HCL overlapping the first bending area BA1 and the second bending area BA2.

Referring back to FIG. 6A, the second coating portion of the coating layer WM-HCL overlapping the first bending area BA1 may have different thicknesses depending on its position. In an embodiment of the invention, one end (e.g., upper end) of the second coating portion may have a thickness greater than that of an opposite end (e.g., lower end) of the second coating portion. The one end of the second coating portion may be closer to the first sub-portion SA of the first coating portion than the opposite end of the second coating portion is.

In an embodiment, the opposite end of the second coating portion adjacent to the sub-coating portion may have a thickness WH2a less than a thickness WH2b of the one end of the second coating portion adjacent to the first sub-portion SA, for example. Particularly, the thickness of the coating layer WM-HCL may gradually increase from the opposite end of the second coating portion to the one end of the second coating portion.

The third coating portion of the coating layer WM-HCL overlapping the second bending area BA2 may have a uniform thickness WH3a as a whole. In an embodiment of the invention, the thickness WH3a of the third coating portion may be the same as the thickness WH1a of the second sub-portion CA.

In addition, the first bending portion overlapping the first bending area BA1 may have a shape different from a shape of the second bending portion overlapping the second bending area BA2. In this case, the restoration force applied to the second bending portion may be less than the restoration force applied to the first bending portion, however, it should not be limited thereto or thereby. That is, the shapes of the first and second bending portions may be changed in various ways, and in an embodiment, the shape of the first bending portion may be symmetrical with the shape of the second bending portion, for example.

The sub-coating portion overlapping the second flat area NBA2 may have a thickness WH4a less than the thickness WH2a of the second coating portion overlapping the first bending area BA1. According to the invention, the thickness of the coating layer WM-HCL may gradually increase in order of the sub-coating portion, the second coating portion, and the first sub-portion SA of the first coating portion.

In addition, in another embodiment, in a case where the sub-coating portion of the coating layer WM-HCL is omitted, the thickness of the coating layer WM-HCL may gradually increase from the second coating portion to the first sub-portion SA of the first coating portion.

Accordingly, the thickness of the first bending portion WM-SP1 (refer to FIG. 2A) of the window WM overlapping the first bending area BA1 shown in FIG. 2A may be less than the thickness of the first flat portion WM-CP1.

Figure 7A:
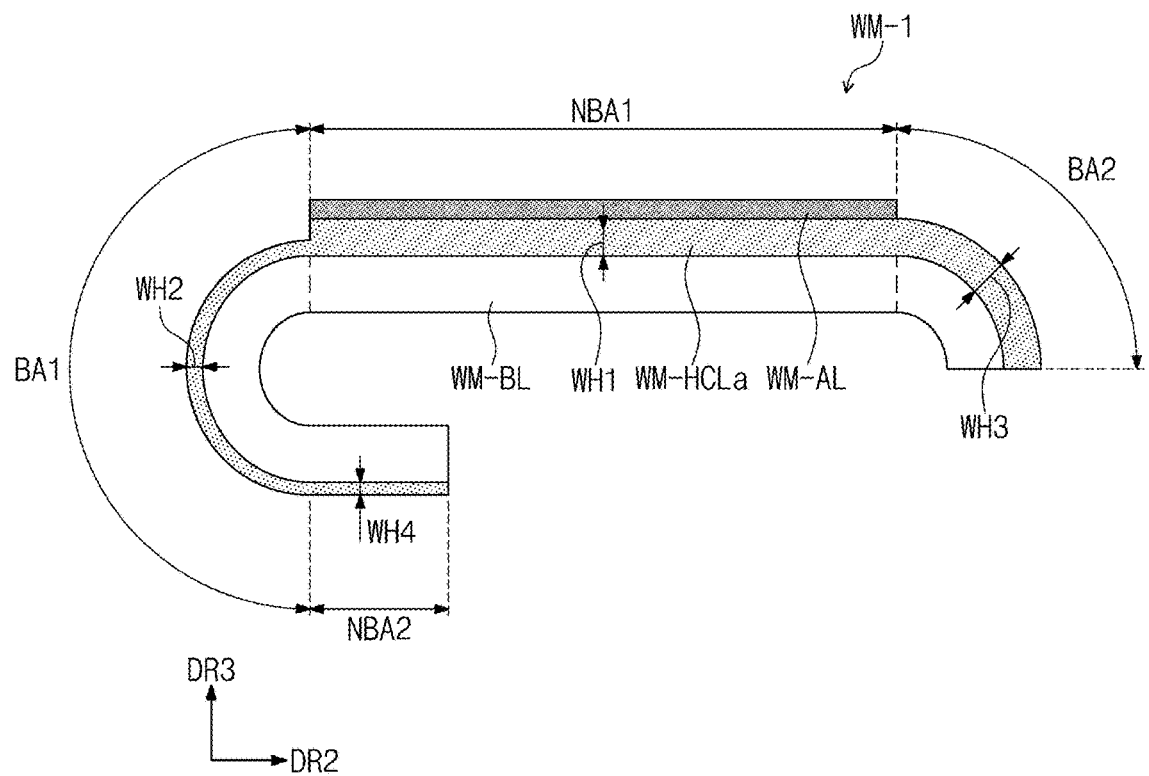
FIG. 7A is a cross-sectional view showing another embodiment of a cover window according to the invention.
Figure 7B:
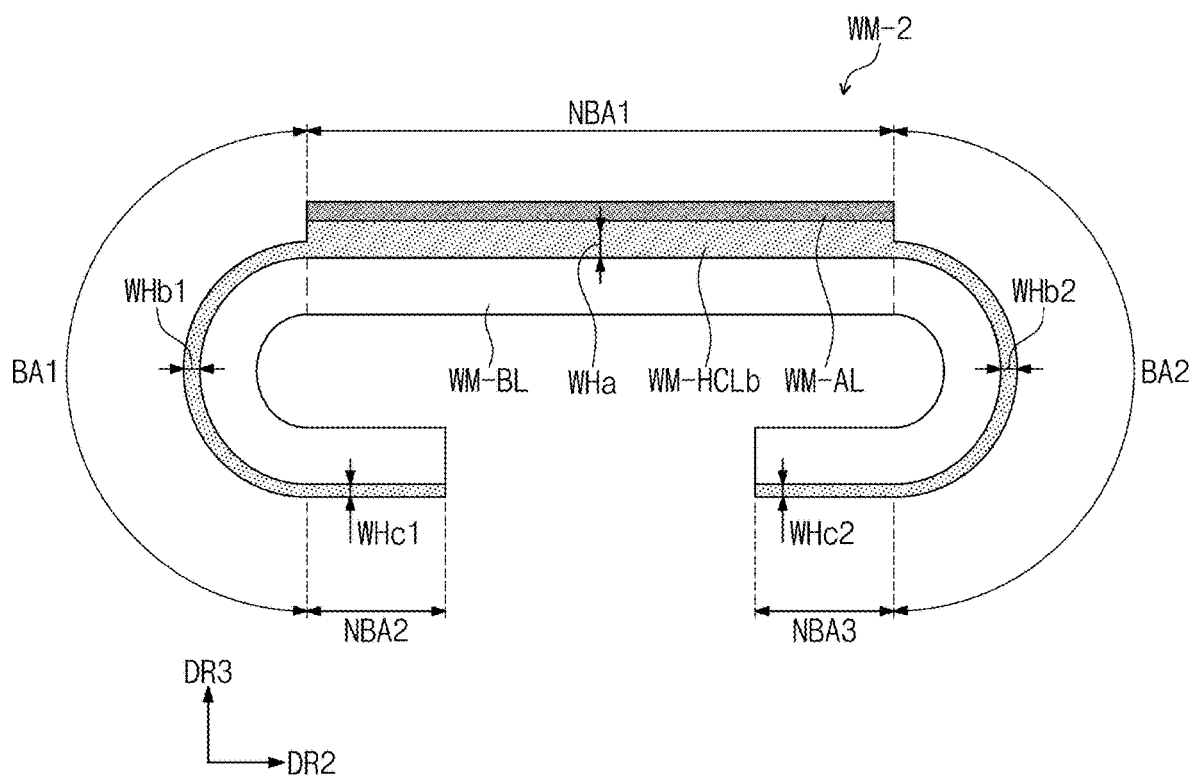
FIG. 7B is a cross-sectional view showing another embodiment of a cover window according to the invention.
Figure 7C:
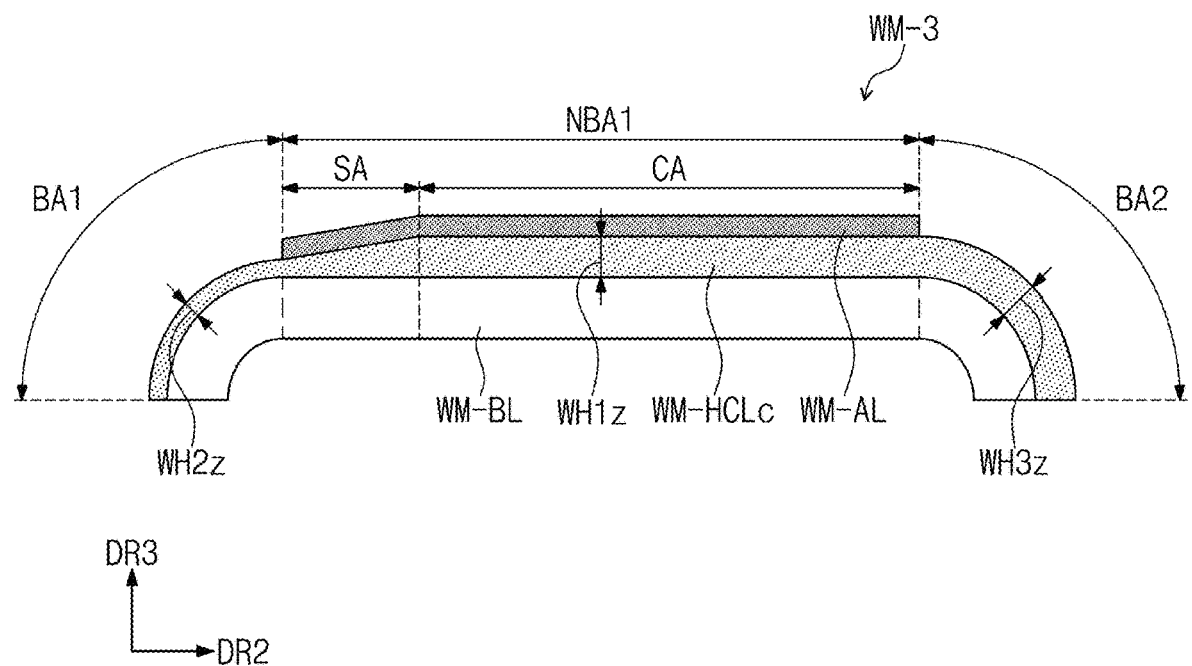
FIG. 7C is a cross-sectional view showing another embodiment of a cover window according to the invention.

FIG. 7A is a cross-sectional view showing another embodiment of a cover window according to the invention. FIG. 7B is a cross-sectional view showing another embodiment of a cover window according to the invention. FIG. 7C is a cross-sectional view showing another embodiment of a cover window according to the invention.

The window WM-1 shown in FIG. 7A may have substantially the same structure as the window WM shown in FIG. 6A except for the shape of the coating layer WM-HCL.

Referring to FIG. 7A, a coating layer WM-HCLa may include a first coating portion disposed on a first flat portion of a base layer WM-BL corresponding to a first flat area NBA1. In an embodiment of the invention, the first coating portion may have a first thickness WH1 that is uniform as a whole.

In addition, the coating layer WM-HCLa may include a second coating portion disposed on a first bending portion of the base layer WM-BL corresponding to a first bending area BA1 and a third coating portion disposed on a second bending portion of the base layer WM-BL corresponding to a second bending area BA2. In an embodiment of the invention, the second coating portion may have a second thickness WH2 less than the first thickness WH1. In an embodiment, the second coating portion may have the second thickness that is uniform as a whole, for example. In another embodiment, similar to the first coating portion shown in FIG. 6A, the second coating portion may have different thicknesses depending on its position. The third coating portion may have a third thickness WH3 that is substantially the same as the first thickness WH1.

In addition, the coating layer WM-HCLa may include a fourth coating portion having a fourth thickness WH4 and disposed on a second flat portion of the base layer WM-BL corresponding to the second flat area NBA2. The fourth thickness WH4 of the fourth coating portion may be equal to or less than the second thickness WH2 of the second coating portion.

A window WM-2 shown in FIG. 7B may further include a third flat area NBA3 extending from a second bending area BA2 when compared with the window WM-1 shown in FIG. 7A.

Referring to FIG. 7B, a first coating portion of a coating layer WM-HCLb may have a first thickness WHa that is uniform as a whole. A second coating portion of the coating layer WM-HCLb may have a second thickness WHb1, and a third coating portion of the coating layer WM-HCLb may have a third thickness WHb2 that is substantially the same as the second thickness WHb1. The second coating portion of the coating layer WM-HCLb may overlap a first bending area BA1, and the third coating portion of the coating layer WM-HCLb may overlap the second bending area BA2. A fourth coating portion and a fifth coating portion of the coating layer WM-HCLb may respectively have a fourth thickness WHc1 and a fifth thickness WHc2 that are the same as each other. In this case, the fourth coating portion of the coating layer WM-HCLb may overlap a second flat area NBA2, and the fifth coating portion of the coating layer WM-HCLb may overlap the third flat area NBA3.

In an embodiment of the invention, the first thickness WHa may be greater than each of the second thickness WHb1 and the third thickness WHb2. In an embodiment, the second thickness WHb1 and the fourth thickness WHc1 may be the same as each other, and the third thickness WHb2 and the fifth thickness WHc2 may be the same as each other, for example, however, they should not be limited thereto or thereby. In another embodiment, the second thickness WHb1 may be greater than the fourth thickness WHc1, and the third thickness WHb2 may be greater than the fifth thickness WHc2.

A window WM-3 shown in FIG. 7C may have a structure from which a second flat area NBA2 is omitted when compared with the window WM-1 shown in FIG. 7A, and other components of the window WM-3 may have substantially the same structure as the window WM-1 shown in FIG. 7A. For the convenience of explanation, descriptions of the other components are omitted.

Referring to FIG. 7C, a coating layer WM-HCLc may include a first coating portion having a first thickness WH1z, a second coating portion having a second thickness WH2z, and a third coating portion having a third thickness WH3z. The first to third coating portions may respectively correspond to the first to third coating portions described with reference to FIG. 7A. That is, the first thickness WH1z may be greater than the second thickness WH2z and may be the same as the third thickness WH3z.

FIGS. 8A to 8G are views showing an embodiment of a method of manufacturing a cover window according to the invention.

Figure 8A:
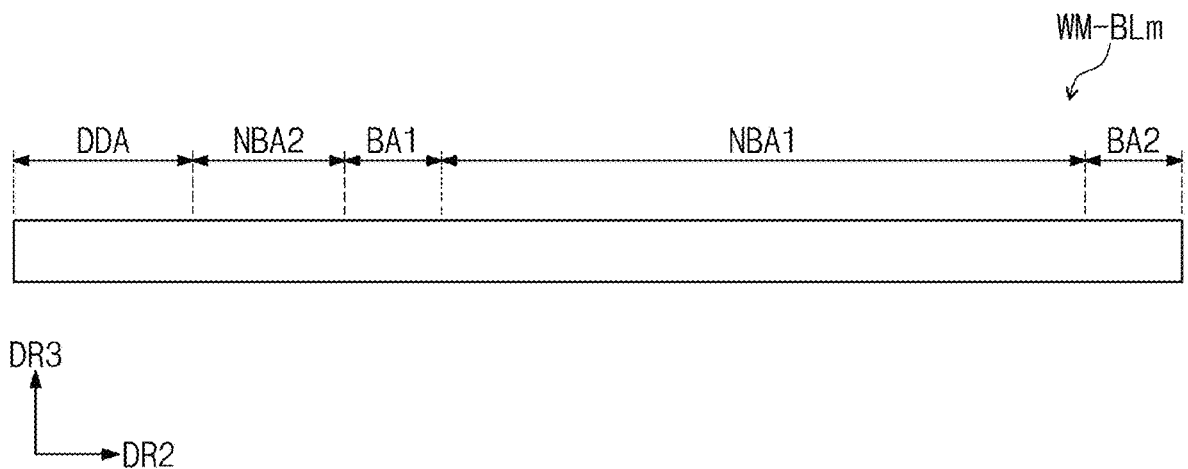
FIGS. 8A to 8G are views showing an embodiment of a method of manufacturing a cover window according to the invention.

Referring to FIG. 8A, a base substrate WM-BLm is prepared. The base substrate WM-BLm may include a dummy area DDA and an effective area, which are defined therein. In an embodiment, the effective area may include the first flat area NBA1, the second flat area NBA2, the first bending area BA1, and the second bending area BA2 that are shown in FIG. 1B. The dummy area DDA may be defined adjacent to the second flat area NBA2.

Figure 8B:
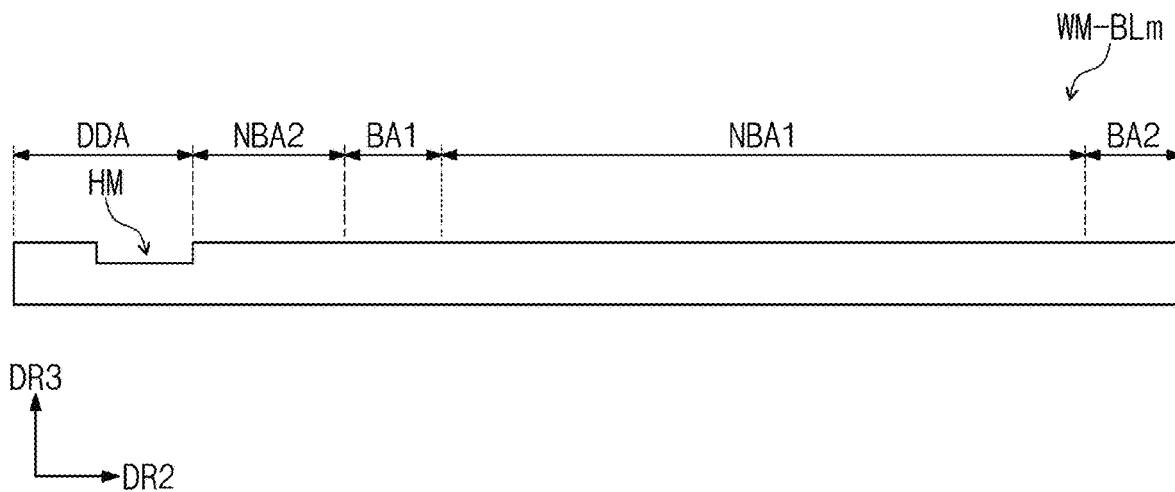

Referring to FIG. 8B, a hole HM may be defined in an upper surface of the base substrate WM-BLm overlapping the dummy area DDA and defined adjacent to the second flat area NBA2. The hole HM may have a shape obtained by recessing a portion of the base substrate WM-BLm from the upper surface of the base substrate WM-BLm.

Figure 8C:
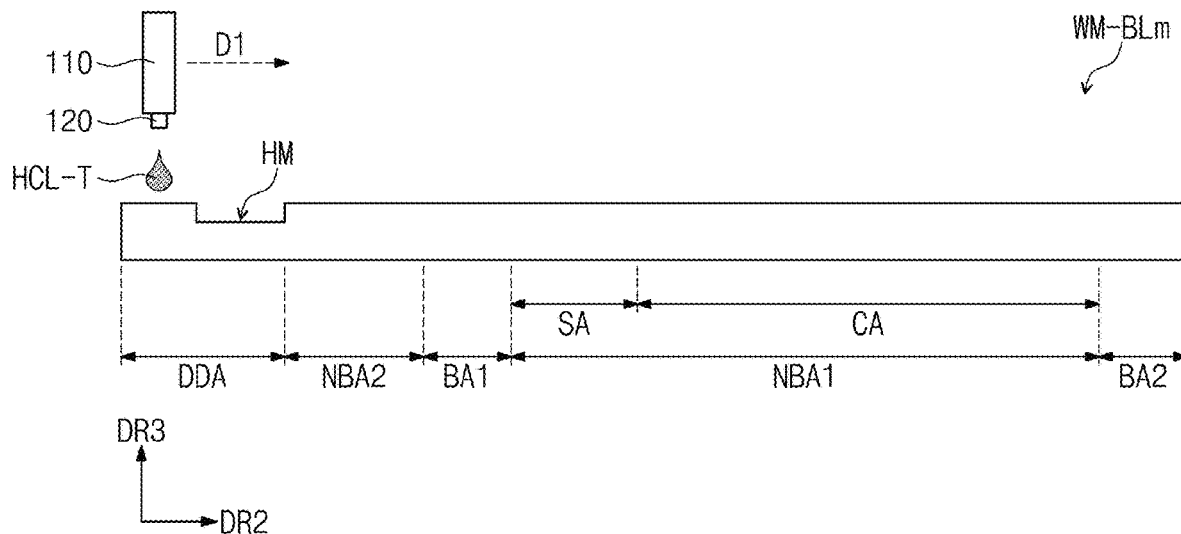

Referring to FIG. 8C, a coating material HCL-T may be coated on the upper surface of the base substrate WM-BLm by using a coating device. In this case, the coating material HCL-T may be a material used to form the coating layer WM-HCL shown in FIG. 4. The coating device may include a storage unit 110 storing the coating material HCL-T and a nozzle 120 connected to the storage unit 110.

In an embodiment of the invention, the coating device may move along a direction D1 corresponding to the second direction DR2. The coating device may provide the coating material HCL-T to the dummy area DDA, and then, may provide the coating material HCL-T to the effective area. In particular, the coating device may move along the direction D1 after forming a predetermined amount of the coating material HCL-T on the base substrate WM-BLm. Here, the predetermined amount means that the coating material HCL-T disposed on the base substrate WM-BLm corresponds to the thickness of the second sub-portion CA shown in FIG. 6A.

Accordingly, in the case where the coating device moves along the direction D1, the predetermined amount of the coating material HCL-T may be disposed on the base substrate WM-BLm. In addition, the coating device may continuously coat the coating material HCL-T through the nozzle 120 while moving along the direction D1.

Figure 8D:
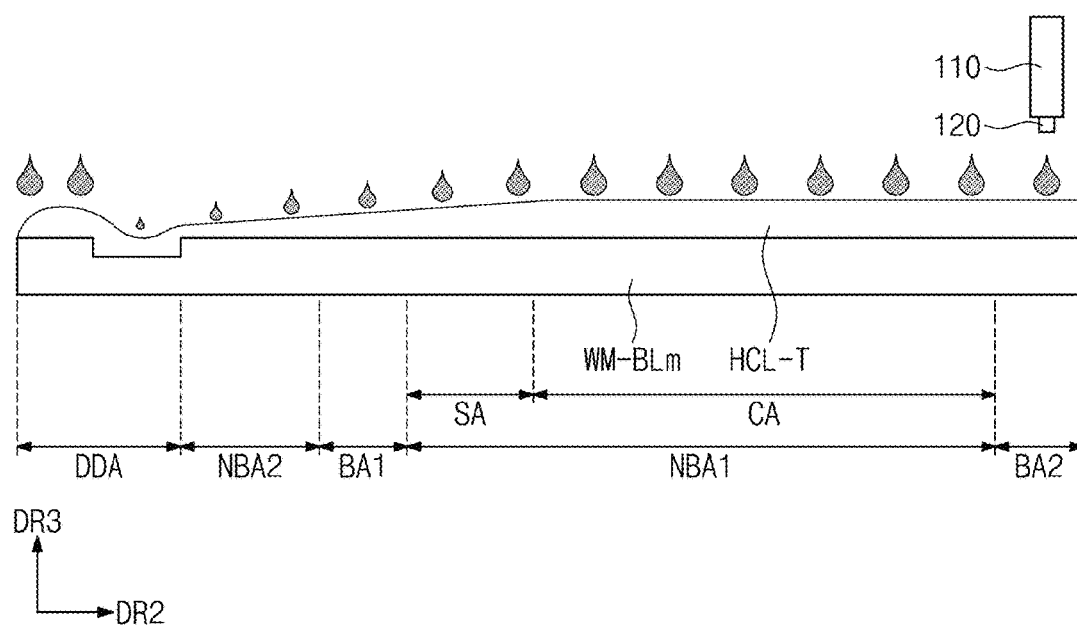

Referring to FIG. 8D, the coating device may move in a direction from one end (e.g., left end) of the dummy area DDA to the effective area. In an initial state in which the coating material HCL-T is coated through the nozzle 120, the predetermined amount of the coating material HCL-T may be disposed in a portion of the dummy area DDA, however, a portion of the coating material HCL-T may be disposed in the hole HM since the dummy area DDA includes the hole HM defined therein. Particularly, as the hole HM is defined adjacent to the second flat area NBA2, less amount of the coating material HCL-T may be disposed on the base substrate WM-BLm overlapping the one end (e.g., left end) of the second flat area NBA2 adjacent to the hole HM than in the initial state.

Then, as the coating device moves along the direction D1, a coating amount of the coating material HCL-T may gradually increase. Accordingly, similar to that shown in FIG. 6A, the thickness of the coating layer WM-HCL may gradually increase in order of the second flat area NBA2, the first bending area BA1, and the first sub-portion SA. In addition, the coating material HCL-T may be disposed on the base substrate WM-BLm overlapping the second sub-portion CA and the second bending area BA2 at a uniform thickness.

Figure 8E:
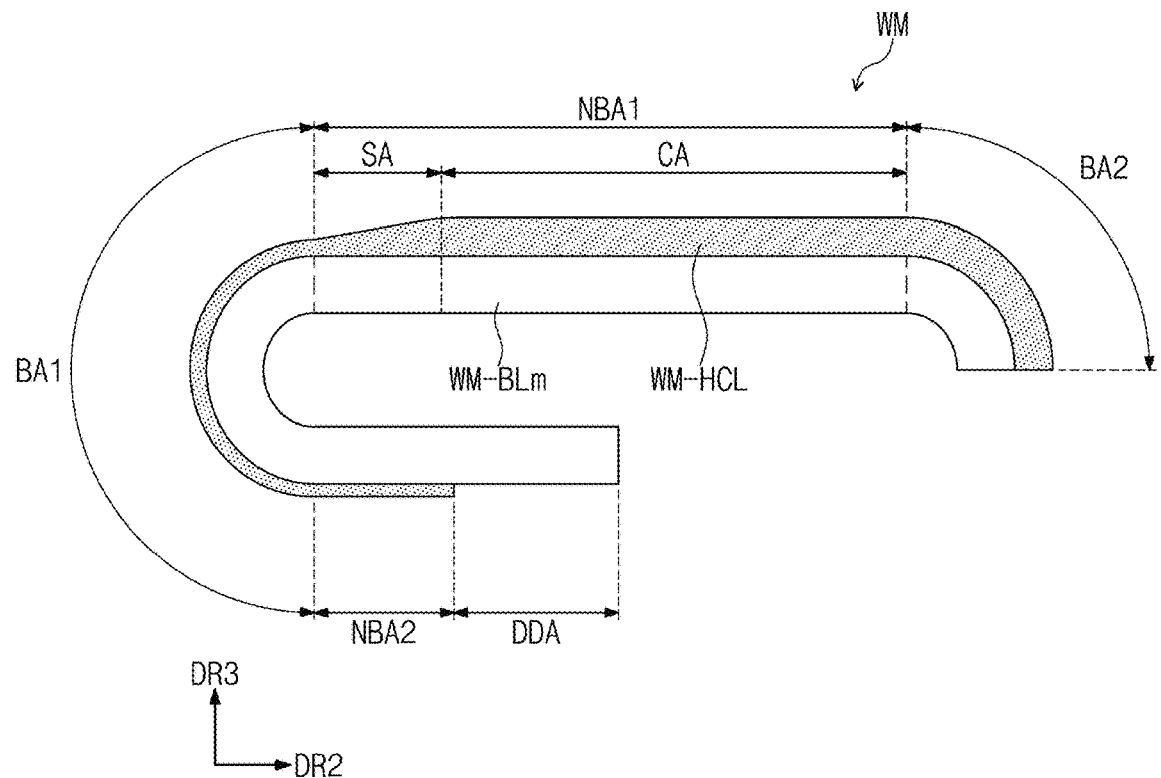

Referring to FIG. 8E, portions of the base substrate WM-BLm may be bent to correspond to the first bending area BA1 and the second bending area BA2. As a result, as shown in FIG. 8E, the base substrate WM-BLm and the coating layer WM-HCL may have the shape of the base layer WM-BL and the coating layer WM-HCL shown in FIG. 6A.

Figure 8F:
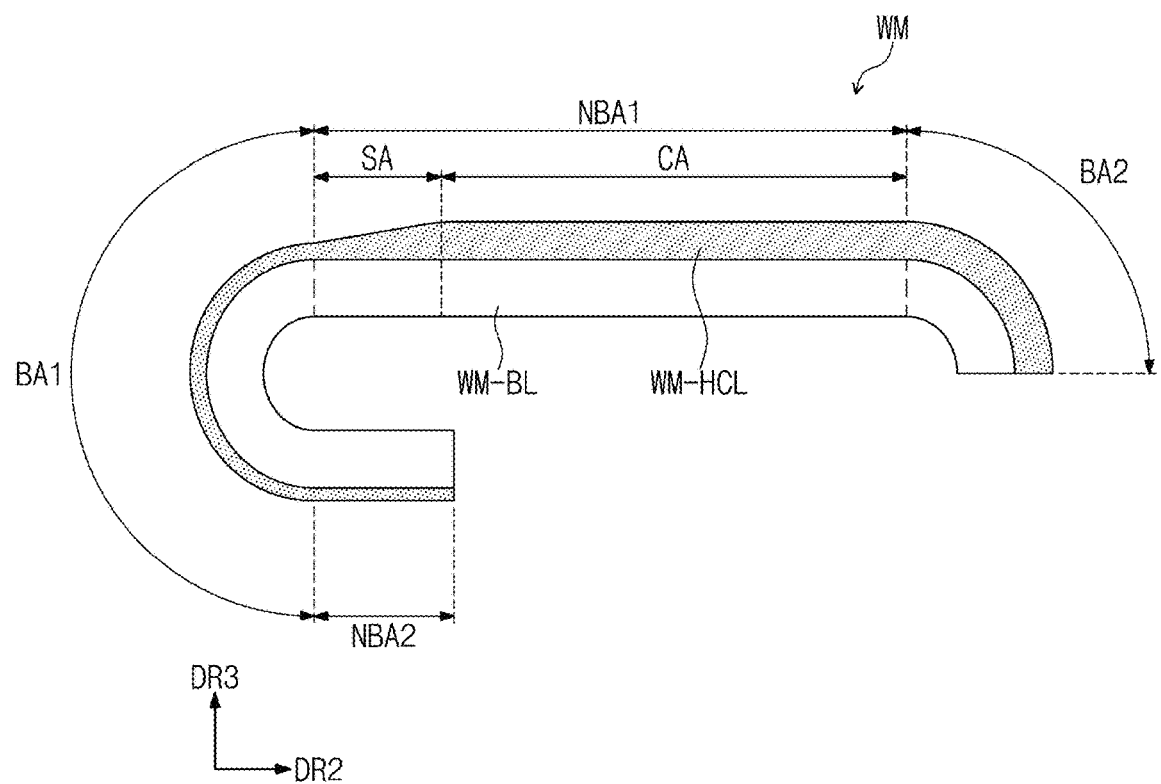

Then, referring to FIG. 8F, the portion of the base substrate WM-BLm overlapping the dummy area DDA may be removed. Accordingly, as shown in FIG. 8F, the base substrate WM-BLm may have the shape of the base layer WM-BL shown in FIG. 6A in the embodiment of the invention. In addition, the coating layer WM-HCL disposed on the base substrate WM-BLm may have the shape of the coating layer WM-HCL shown in FIG. 6A.

Figure 8G:
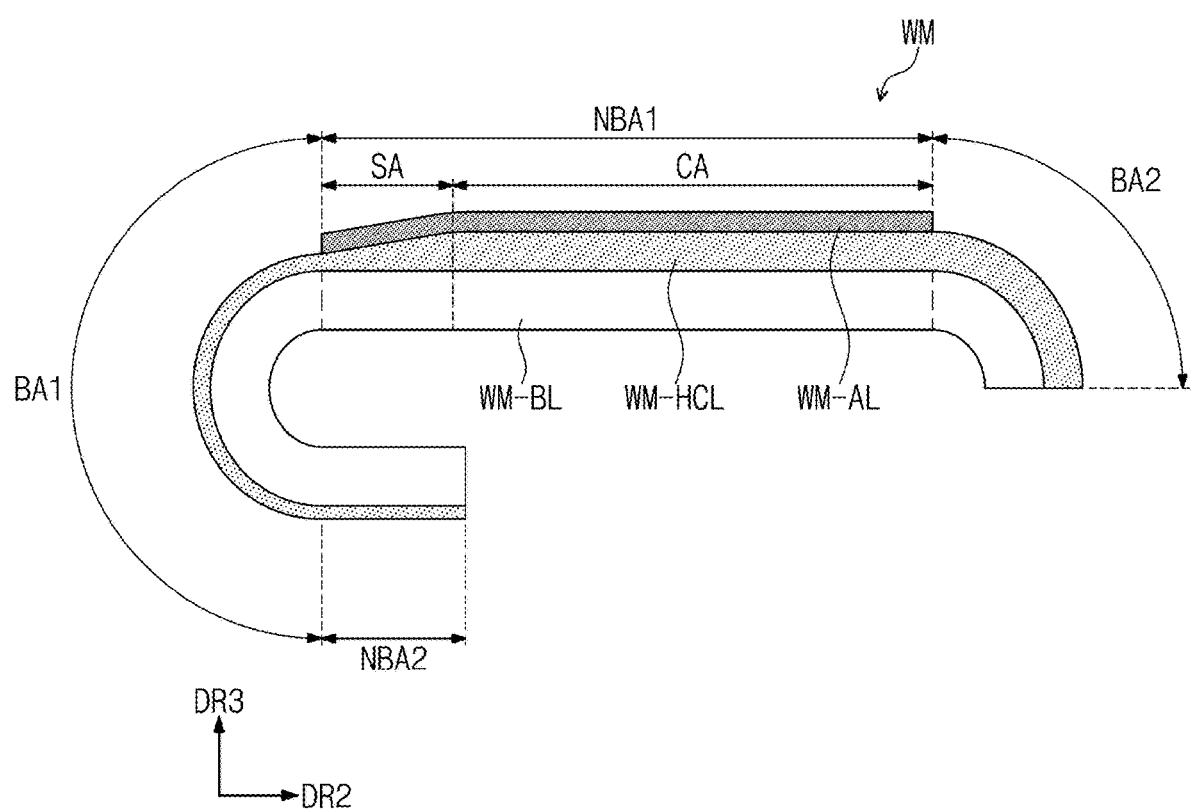

Referring to FIG. 8G, the auxiliary coating layer WM-AL may be disposed on the coating layer WM-HCL overlapping the first flat area NBA1.

Although the embodiments of the invention have been described, it is understood that the invention should not be limited to these embodiments but various changes and modifications may be made by one ordinary skilled in the art. Therefore, the disclosed subject matter should not be limited to any single embodiment described herein.

What is claimed is:
1. A cover window comprising:
   a base layer comprising a first flat portion, a first bending portion bent from a first end of the first flat portion, and a second bending portion bent from a second end of the first flat portion; and
   a coating layer comprising a first coating portion disposed on the first flat portion, a second coating portion disposed on the first bending portion and only having a thickness less than a minimum thickness of the first coating portion in a thickness direction other than a boundary of the first coating portion and the second coating portion, and a third coating portion disposed on the second bending portion having a thickness greater than the thickness of the second coating portion, wherein a first end of the second coating portion has a thickness greater than a thickness of a second end of the second coating portion, and the first end of the second coating portion is closer to the first coating portion than the second end of the second coating portion is, and the first coating portion includes a same material as a material of the second coating portion and extends through opposite edges of the first flat portion in a main plane extension direction, to which the thickness direction is normal, of the first flat portion.

2. The cover window of claim 1, wherein a thickness of the coating layer increases from the second end of the second coating portion to the first end of the second coating portion.

3. The cover window of claim 1, wherein the first coating portion comprises a first sub-portion and a second sub-portion parallel to the upper surface of the first flat portion, and the first sub-portion is inclined from the second sub-portion and is closer to the second coating portion than the second sub-portion.

4. The cover window of claim 3, wherein the second sub-portion has a thickness greater than a thickness of the first sub-portion.

5. The cover window of claim 3, wherein the second sub-portion has an area greater than an area of the first sub-portion in a plan view.

6. The cover window of claim 1, wherein the third coating portion has a same thickness as a thickness of the second sub-portion.

7. The cover window of claim 1, wherein each of the second sub-portion and the third coating portion has a uniform thickness.

8. The cover window of claim 1, wherein the base layer further comprises a second flat portion spaced apart from the first flat portion, facing the first flat portion, and having a unitary shape with the first flat portion and the first bending portion, and the coating layer further comprises a sub-coating portion having a thickness less than the thickness of the second coating portion and disposed on the second flat portion.

9. The cover window of claim 8, wherein the first flat portion has an area greater than an area of the second flat portion in a plan view.

10. The cover window of claim 1, further comprising an auxiliary coating layer disposed on the first flat portion, wherein the auxiliary coating layer non-overlaps the second coating portion.

11. The cover window of claim 10, wherein each of a portion of the auxiliary coating layer adjacent to the second coating portion and the first coating portion disposed between the portion of the auxiliary coating layer and the first flat portion has a shape inclined from an upper surface of the first flat portion.

12. The cover window of claim 1, wherein the thickness of the first coating portion is equal to or greater than 20 micrometers and equal to or less than 100 micrometers, and the thickness of the second coating portion is equal to or greater than 1 micrometers and equal to or less than 20 micrometers.

13. A display device comprising:

a display module comprising a first flat area comprising a first display area, a first bending area bent from a first end of the first flat area and comprising a second display area, a second flat area comprising a third display area, and a second bending area bent from a second end of the first flat area and comprising a fourth display area, the second flat area being spaced apart from the first flat area and facing the first flat area;

a cover window comprising a first cover portion corresponding to the first flat area, a second cover portion corresponding to the first bending area, a third cover portion corresponding to the second flat area, and a fourth cover portion corresponding to the second bending area; and an adhesive layer disposed between the display module and the cover window, wherein the first cover portion only has a thickness in a thickness direction greater than a maximum thickness of the second cover portion other than a boundary of the first cover portion and the second cover portion, and the thickness of the second cover portion is greater than a thickness of the third cover portion, the first cover portion includes a same material as a material of the second cover portion and extends through opposite edges of the first flat area in a main plane extension direction, to which the thickness direction is normal, of the first flat area, and a fourth cover portion has a thickness greater than the thickness of the second cover portion.

14. The display device of claim 13, wherein the first cover portion comprises a flat portion and an inclined portion inclined from the flat portion, the inclined portion is disposed between the second cover portion and the flat portion, and the flat portion has a thickness greater than a thickness of the inclined portion.

15. The display device of claim 13, wherein the first display area has a size greater than a size of the third display area.

* * * * *